US010453510B2

(12) United States Patent
Park et al.

(10) Patent No.: US 10,453,510 B2
(45) Date of Patent: Oct. 22, 2019

(54) MEMORY DEVICE

(71) Applicant: Industry-University Cooperation Foundation Hanyang University, Seoul (KR)

(72) Inventors: Jea Gun Park, Seongnam-si (KR); Du Yeong Lee, Seoul (KR); Seung Eun Lee, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 0 days.

(21) Appl. No.: 16/075,474

(22) PCT Filed: Feb. 3, 2017

(86) PCT No.: PCT/KR2017/001234
§ 371 (c)(1),
(2) Date: Aug. 3, 2018

(87) PCT Pub. No.: WO2017/135767
PCT Pub. Date: Aug. 10, 2017

(65) Prior Publication Data
US 2019/0043548 A1    Feb. 7, 2019

(30) Foreign Application Priority Data

Feb. 5, 2016   (KR) .................. 10-2016-0015086
Feb. 5, 2016   (KR) .................. 10-2016-0015139
(Continued)

(51) Int. Cl.
*G11C 11/16* (2006.01)
*H01L 43/02* (2006.01)
(Continued)

(52) U.S. Cl.
CPC ............ *G11C 11/161* (2013.01); *H01L 43/02* (2013.01); *H01L 43/04* (2013.01); *H01L 43/08* (2013.01); *H01L 43/10* (2013.01); *H01L 43/12* (2013.01)

(58) Field of Classification Search
CPC ....... G11C 11/161; H01L 43/02; H01L 43/04; H01L 43/08; H01L 43/10; H01L 43/12
(Continued)

(56) References Cited

U.S. PATENT DOCUMENTS 10,115,890 B2 *  10/2018  Nakata .................. B81B 7/02
2013/0299823 A1  11/2013  Cao et al.
(Continued)

FOREIGN PATENT DOCUMENTS

KR      10-2008-0070812      7/2008
KR         10-1040163 B1     6/2011
(Continued)

OTHER PUBLICATIONS

International Search Report for PCT/KR2017/001234 dated Apr. 25, 2017 [PCT/ISA/210].
(Continued)

*Primary Examiner* — Fernando Hidalgo
(74) *Attorney, Agent, or Firm* — Sughrue Mion, PLLC

(57) ABSTRACT

The present invention provides a memory device in which a lower electrode, a seed layer, synthetic antiferromagnetic (SyAF) layers, a separation layer, a magnetic tunnel junction, a capping layer, and an upper electrode are formed on a substrate in a laminated manner, wherein a diffusion barrier is formed between the magnetic tunnel junction and the capping layer. In addition, the present invention provides a memory device in which a lower electrode, a seed layer, SyAF layers, a separation layer, a magnetic tunnel junction, a capping layer, and an upper electrode are formed on a substrate in a laminated manner, wherein the seed layer is formed of a material that allows the SyAF layers to grow in the FCC (111) direction.

5 Claims, 23 Drawing Sheets

(30) Foreign Application Priority Data

Feb. 5, 2016 (KR) .......................... 10-2016-0015154
Feb. 5, 2016 (KR) .......................... 10-2016-0015176

(51) Int. Cl.
*H01L 43/08* (2006.01)
*H01L 43/10* (2006.01)
*H01L 43/12* (2006.01)
*H01L 43/04* (2006.01)

(58) Field of Classification Search
USPC ........................................................ 365/158
See application file for complete search history.

(56) References Cited

U.S. PATENT DOCUMENTS

| | | |
|---|---|---|
| 2013/0334629 A1 | 12/2013 | Kula et al. |
| 2014/0306302 A1 | 10/2014 | Jan et al. |
| 2014/0306305 A1 | 10/2014 | Cao et al. |

FOREIGN PATENT DOCUMENTS

| | | |
|---|---|---|
| KR | 10-2014-0025165 A | 3/2014 |
| KR | 10-2015-0120857 | 10/2015 |

OTHER PUBLICATIONS

Notice of Office Action dated Aug. 24, 2018 in the Korean Patent Office in Korean Application No. 10-2016-0015176.

* cited by examiner

MEMORY DEVICE

CROSS REFERENCE TO RELATED APPLICATIONS

This application is a National Stage of International Application No. PCT/KR2017/001234, filed Feb. 3, 2017, claiming priorities based on Korean Patent Application Nos. 10-2016-0015139, 10-2016-0015176, 10-2016-0015086 and 10-2016-0015154, filed Feb. 5, 2016 respectively, the contents of all of which are incorporated herein by reference in their entirety.

TECHNICAL FIELD

The present invention relates to a memory device, and more particularly, to a magnetic memory device using a magnetic tunnel junction (MTJ).

BACKGROUND ART

Next-generation non-volatile memory devices with lower power consumption and higher degree of integration than flash memory devices are being studied. Such next-generation non-volatile memory devices include phase-change random access memory (PRAM) that uses state changes of a phase change material such as chalcogenide alloys, magnetic random access memory (MRAM) that uses resistance changes in a magnetic tunnel junction (MTJ) depending on the magnetization state of a ferromagnetic material, ferroelectric random access memory (FRAM) that uses polarization of a ferroelectric material, resistance-change random access memory (ReRAM) that uses resistance changes in a variable resistance material, and the like.

Examples of MRAM include a spin-transfer torque magnetic random access memory (STT-MRAM) device that inverts magnetization using a spin-transfer torque (STT) phenomenon generated by electron injection and discriminates a resistance difference before and after magnetization inversion. The STT-MRAM device includes a magnetic tunnel junction, which consists of a pinned layer and a free layer, each formed of a ferromagnetic material, and a tunnel barrier disposed therebetween. In the magnetic tunnel junction, when the magnetization directions of the free layer and the pinned layer are the same (that is, parallel), current flow is easy and consequently the magnetic tunnel junction is in a low resistance state. On the other hand, when the magnetization directions are different (that is, antiparallel), current is reduced and consequently the magnetic tunnel junction is in a high resistance state. In addition, in the magnetic tunnel junction, the magnetization directions must change only in the direction perpendicular to a substrate. Therefore, the free layer and the pinned layer must have perpendicular magnetization values. When the perpendicular magnetization values are symmetrical with respect to 0 according to the intensity and direction of a magnetic field, and a squareness (S) shape becomes clear (S=1), perpendicular magnetic anisotropy (PMA) is considered to be excellent. The STT-MRAM device is theoretically capable of cycling more than $10^{15}$ times and can be switched at a high speed of about a few nanoseconds (ns). In particular, a perpendicular magnetization type STT-MRAM device is advantageous in that there is no theoretical scaling limit, and as scaling progresses, the current density of driving current may be lowered. Therefore, the perpendicular magnetization type STT-MRAM device has been actively studied as a next-generation memory device that may replace DRAM devices.

An example of the STT-MRAM device is disclosed in Korean Patent No. 10-1040163.

In the STT-MRAM device, a seed layer is formed on the lower part of the free layer, a separation layer is formed on the upper part of the pinned layer, and synthetic antiferromagnetic (SyAF) layers and an upper electrode are formed on the upper part of the separation layer. In addition, in the STT-MRAM device, a silicon oxide film is formed on a silicon substrate, and then the seed layer and a magnetic tunnel junction are formed thereon. In addition, a selection element such as a transistor may be formed on the silicon substrate, and the silicon oxide film may be formed so as to cover the selection element. Therefore, the STT-MRAM device has a laminated structure in which a silicon oxide film, a seed layer, a free layer, a tunnel barrier, a pinned layer, a separation layer, SyAF layers, and an upper electrode are formed on a silicon substrate on which a selection element is formed. In this case, the separation layer and a capping layer are formed using tantalum (Ta), and the SyAF layers have a structure in which a lower magnetic layer and an upper magnetic layer, in which a magnetic metal and a non-magnetic metal are alternately laminated, are formed, and a non-magnetic layer is formed therebetween. That is, on the substrate, the magnetic tunnel junction is formed on the lower part and the SyAF layers are formed on the upper part.

However, since SyAF layers with a face-centered cubic (FCC) (111) structure are formed on the upper side of the magnetic tunnel junction in which texturing is performed in the body-centered cubic (BCC) (100) direction, the FCC (111) structure diffuses into the magnetic tunnel junction when the SyAF layers are formed, which may deteriorate the BCC (100) crystal. That is, when the SyAF layers are formed, some of a material forming the SyAF layers may diffuse into the magnetic tunnel junction, thus deteriorating the crystallinity of the magnetic tunnel junction. Therefore, the magnetization direction of the magnetic tunnel junction may not be rapidly changed, such that the operation speed of a memory may be lowered or the memory may not operate.

To overcome this problem, SyAF layers may be first formed on a substrate, and then a magnetic tunnel junction may be formed thereon. In this case, the SyAF layers are formed on a seed layer, and the seed layer is formed using any one of ruthenium (Ru), hafnium (Hf), and tantalum (Ta). When the magnetic tunnel junction is formed on the SyAF layers, the SyAF layers must grow in the FCC (111) direction to fix the pinned layer of the magnetic tunnel junction in the perpendicular direction. However, Ru, Hf, and Ta, which are generally used to form a seed layer, are not suitable for growth of the SyAF layers in the FCC (111) direction, and thus a high magnetoresistance (MR) ratio may not be generated in the magnetic tunnel junction.

In addition, after a memory device is formed in this manner, a passivation process and a metal wiring process are performed at a temperature of about 400° C. However, Ta used to form a separation layer and a capping layer diffuses into the magnetic tunnel junction, which lowers the perpendicular magnetic anisotropy of the magnetic tunnel junction. As a result, a high magnetoresistance ratio may not be generated.

In addition, the SyAF layers generally have a structure in which a first magnetic layer having a multilayer structure, a non-magnetic layer, and a second magnetic layer having a multilayer structure are laminated. For example, the first magnetic layer is formed by laminating cobalt (Co) and platinum (Pt) at least six times, and the second magnetic layer is formed by laminating Co and Pt at least three times.

Since the first and second magnetic layers are each formed in a multilayer structure, the memory device becomes thick. In addition, rare-earth elements are often used to form the first and second magnetic layers, and thus processing costs increase.

DISCLOSURE

Technical Problem

Therefore, the present invention has been made in view of the above problems, and it is one object of the present invention to provide a memory device in which SyAF layers and a magnetic tunnel junction are laminated on a substrate. According to the memory device of the present invention, diffusion of a material forming a capping layer formed on the magnetic tunnel junction may be prevented.

It is another object of the present invention to provide a memory device in which a magnetic tunnel junction is formed on SyAF layers. According to the present invention, the magnetoresistance ratio of the memory device may be improved. In addition, in the memory device of the present invention, growth of SyAF layers proceeds in the FCC (111) direction, so that the magnetization of the pinned layer of the magnetic tunnel junction is fixed in the perpendicular direction.

It is another object of the present invention to provide a memory device capable of improving the crystallinity of a magnetic tunnel junction. In addition, according to the memory device of the present invention, diffusion of a material forming SyAF layers into the magnetic tunnel junction may be prevented, thereby improving the crystallinity of the magnetic tunnel junction. In addition, diffusion of materials forming a separation layer and a capping layer into the magnetic tunnel junction may be prevented, thereby improving the crystallinity of the magnetic tunnel junction.

It is yet another object of the present invention to provide a memory device capable of preventing diffusion of a material forming SyAF layers into a magnetic tunnel junction to improve the crystallinity of the magnetic tunnel junction. In addition, according to the present invention, the thickness of the SyAF layers may be reduced, thereby reducing processing costs and the total thickness of the memory device.

Technical Solution

In accordance with one aspect of the present invention, provided is a memory device in which a lower electrode, a seed layer, SyAF layers, a separation layer, a magnetic tunnel junction, a capping layer, and an upper electrode are formed on a substrate in a laminated manner, wherein a diffusion barrier is formed between the magnetic tunnel junction and the capping layer.

The memory device may further include an oxide layer formed between the magnetic tunnel junction and the diffusion barrier.

In the magnetic tunnel junction, a pinned layer, a tunnel barrier, and free layers may be laminated, and the free layers may include a first magnetization layer, an insertion layer having no magnetization, and a second magnetization layer.

The free layers may have perpendicular magnetic anisotropy.

The capping layer may be formed of a material having a body-centered cubic (BCC) structure, and may be formed of a material including tungsten (W).

The diffusion barrier may be formed of a material having a smaller atomic radius than the material forming the capping layer.

The diffusion barrier may be formed of at least one of iron (Fe), chromium (Cr), molybdenum (Mo), and vanadium (V).

The diffusion barrier may be formed to have a thickness of 0.1 nm to 0.7 nm.

In accordance with another aspect of the present invention, provided is a memory device in which a lower electrode, a seed layer, SyAF layers, a separation layer, a magnetic tunnel junction, and an upper electrode are formed on a substrate in a laminated manner, wherein the magnetic tunnel junction includes double free layers, and an oxide layer, a diffusion barrier, and a capping layer are formed in a laminated manner between the magnetic tunnel junction and the upper electrode, wherein the diffusion barrier prevents the material of the capping layer from diffusing into at least the oxide layer.

The oxide layer may be formed of MgO, the diffusion barrier may be formed of Fe, and the capping layer may be formed of W.

The diffusion barrier may be formed of Fe to have a thickness of 0.1 nm to 0.7 nm.

In accordance with another aspect of the present invention, provided is a memory device in which a lower electrode, a seed layer, SyAF layers, a separation layer, a magnetic tunnel junction, a capping layer, and an upper electrode are formed on a substrate in a laminated manner, wherein the seed layer is formed of a material that allows the SyAF layers to grow in the FCC (111) direction.

The seed layer may be formed of a metal selected from the group consisting of titanium (Ti), palladium (Pd), platinum (Pt), magnesium (Mg), cobalt (Co), aluminum (Al), and tungsten (W) or an alloy thereof.

The seed layer may be formed of platinum (Pt) to have a thickness of 2 nm to 6 nm.

A magnetoresistance ratio is 60% to 140% depending on the thickness of the seed layer formed of platinum.

The magnetic tunnel junction may include a pinned layer, a tunnel barrier, and free layers, and the free layers may have a structure in which an insertion layer is formed between first and second free layers.

The memory device may further include an oxide layer formed between the magnetic tunnel junction and the capping layer.

At least one of the separation layer, the insertion layer, and the capping layer may be formed of a material having a BCC structure.

In accordance with another aspect of the present invention, provided is a memory device in which a lower electrode, a seed layer, SyAF layers, a separation layer, a magnetic tunnel junction, a capping layer, and an upper electrode are formed on a substrate in a laminated manner, wherein the seed layer is formed of platinum (Pt) to have a thickness of 2 nm to 6 nm.

In accordance with another aspect of the present invention, provided is a memory device in which a seed layer, SyAF layers, a separation layer, a magnetic tunnel junction, and a capping layer are formed in a laminated manner between two electrodes, wherein the magnetic tunnel junction includes an insertion layer formed between two free layers, and at least one of the separation layer, the insertion layer, and the capping layer is formed of a material having a BCC structure.

The magnetic tunnel junction may be formed on the SyAF layers.

The memory device may further include an oxide layer formed between the magnetic tunnel junction and the capping layer.

At least one of the separation layer, the insertion layer, and the capping layer may be formed of a material having a lattice constant of less than 330 pm.

At least one of the separation layer, the insertion layer, and the capping layer may be formed of at least one of tungsten, vanadium, chromium, and molybdenum.

The capping layer may be formed thicker than the separation layer and the insertion layer, and the separation layer and the insertion layer may be formed to have identical thicknesses or different thicknesses.

The capping layer may be formed to have a thickness of 1 nm to 6 nm, and the separation layer and the insertion layer may each be formed to have a thickness of 0.2 nm to 0.5 nm.

In accordance with another aspect of the present invention, provided is a memory device in which a lower electrode, a seed layer, SyAF layers, a separation layer, a magnetic tunnel junction, a capping layer, and an upper electrode are formed on a substrate in a laminated manner, wherein the magnetic tunnel junction includes an insertion layer formed between two free layers, and at least one of the separation layer, the insertion layer, and the capping layer is formed of a material having a BCC structure and a lattice constant of less than 330 pm.

At least one of the separation layer, the insertion layer, and the capping layer may be formed of at least one of tungsten, vanadium, chromium, and molybdenum.

In accordance with another aspect of the present invention, provided is a memory device in which a seed layer, SyAF layers, a separation layer, a magnetic tunnel junction, and a capping layer are formed in a laminated manner between two electrodes, wherein the SyAF layers consist of one magnetic layer and one non-magnetic layer.

The magnetic tunnel junction may be formed on the SyAF layers.

The memory device may further include a buffer layer formed between the SyAF layers and the separation layer.

The buffer layer may be formed of a magnetic material to form a single layer, and may be formed thinner than the magnetic layer of the SyAF layers.

The memory device may further include an oxide layer formed between the magnetic tunnel junction and the capping layer.

In accordance with yet another aspect of the present invention, provided is a memory device in which a seed layer, SyAF layers, a separation layer, a magnetic tunnel junction, and a capping layer are formed in a laminated manner between two electrodes, wherein the magnetic tunnel junction includes a pinned layer, a tunnel barrier, and free layers, wherein the free layers include first and second free layers and an insertion layer formed between the first and second free layers.

The first and second free layers may each be formed of a material including CoFeB, and the first free layer may be formed to have a thickness that is thinner than or equal to the thickness of the second free layer.

The separation layer may be formed of a material having a BCC structure, and may be formed to have a thickness of 0.1 nm to 0.5 nm.

Advantageous Effects

In the memory device of the present invention, a lower electrode is formed of a polycrystalline material, SyAF layers are formed thereon, and then a magnetic tunnel junction is formed. Therefore, since the FCC (111) structure of the SyAF layers does not diffuse into the magnetic tunnel junction, the BCC (100) crystal structure of the magnetic tunnel junction can be preserved. As a result, the magnetization direction of the magnetic tunnel junction can be rapidly changed, thereby improving the operating speed of the memory device.

In addition, in the memory device of the present invention, since a diffusion barrier is formed between the magnetic tunnel junction and a capping layer, a material forming the capping layer can be prevented from diffusing into the magnetic tunnel junction. Therefore, normal operation of the magnetic tunnel junction can be ensured, and thus the operation reliability of the memory device can be improved.

In addition, in the memory device of the present invention, since a seed layer is formed of a material including platinum (Pt), growth of the SyAF layers in the FCC (111) direction can be promoted, and the magnetization of a pinned layer can be fixed in the perpendicular direction. Therefore, a high magnetoresistance ratio can be realized as compared with a conventional case.

In addition, in the memory device of the present invention, since at least one of a separation layer formed between the SyAF layers and the magnetic tunnel junction, an insertion layer formed between double free layers, and the capping layer formed on the magnetic tunnel junction is formed of a material having a BCC structure, such as tungsten, the perpendicular magnetic anisotropy of the magnetic tunnel junction can be maintained even at a temperature of about 400° C.

In addition, in the memory device of the present invention, since the SyAF layers are formed to have one magnetic layer and one non-magnetic layer, the thickness of the SyAF layers can be reduced. As a result, the total thickness of the memory device can be reduced. In addition, the amount of a material used to form the SyAF layers can be reduced, thereby reducing processing costs.

BEST MODE

Hereinafter, preferred embodiments of the present invention will be described in detail with reference to the accompanying drawings. However, the present invention may be embodied in many different forms and should not be construed as limited to the embodiments set forth herein. Rather, these embodiments are provided so that this disclosure will be thorough and complete, and will fully convey the scope of the disclosure to those skilled in the art.

Figure 1:
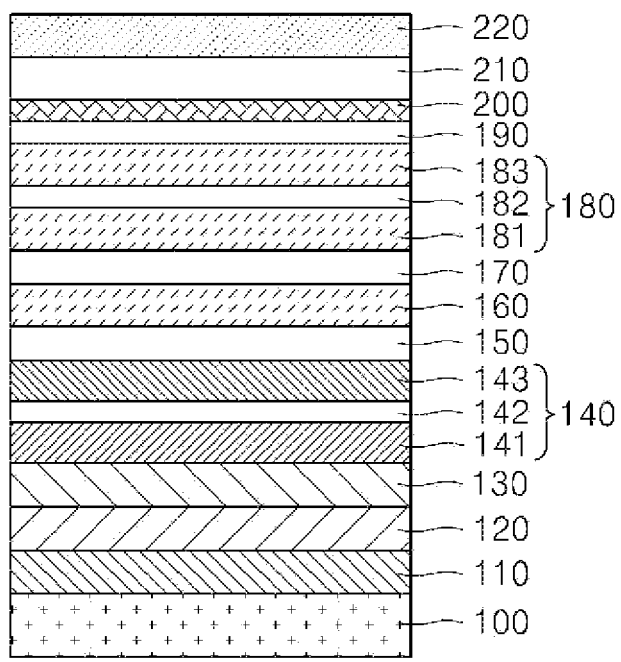
FIG. 1 is a cross-sectional view of a memory device according to one embodiment of the present invention.

FIG. 1 is a cross-sectional view of a memory device according to one embodiment of the present invention, that is, a cross-sectional view of an STT-MRAM device.

Referring to FIG. 1, a memory device according to one embodiment of the present invention includes a lower electrode 110, a first buffer layer 120, a seed layer 130, SyAF layers 140, a separation layer 150, a pinned layer 160, a tunnel barrier 170, free layers 180, a second buffer layer 190, a diffusion barrier 200, a capping layer 210, and an upper electrode 220, which are formed on a substrate 100. In this case, the SyAF layers 140 are formed by laminating a first magnetic layer 141, a non-magnetic layer 142, and a second magnetic layer 143, and the pinned layer 160, the tunnel barrier 170, and the free layers 180 form a magnetic tunnel junction. That is, on the substrate 100, the components of the memory device are laminated in the order listed above. In this case, the lower electrode 110 is positioned at the bottom and the upper electrode 220 is positioned at the top. According to one embodiment of the present invention, the SyAF layers 140 are first formed on the substrate 100, and then the magnetic tunnel junction is formed thereon.

The substrate 100 may be a semiconductor substrate. For example, as the substrate 100, a silicon substrate, a gallium arsenide substrate, a silicon germanium substrate, a silicon oxide film substrate, or the like may be used. In this embodiment, a silicon substrate is used. In addition, a selection element including a transistor may be formed on the substrate 100. In addition, an insulating layer (not shown) may be formed on the substrate 100. That is, the insulating layer may be formed to cover predetermined structures such as a selection element, and may be provided with a contact hole exposing at least a part of the selection element. The insulating layer may be formed using a silicon oxide ($SiO_2$) film having an amorphous structure.

The lower electrode 110 is formed on the substrate 100. The lower electrode 110 may be formed using conductive materials, such as metals and metal nitrides. In addition, the lower electrode 110 of the present invention may be formed as at least one layer. That is, the lower electrode 110 may be formed as a single layer or as two or more layers. When the lower electrode 110 is formed as a single layer, the lower electrode 110 may be formed of a metal nitride, such as a titanium nitride (TiN) film. In addition, the lower electrode 110 may be formed as a dual structure in which first and second lower electrodes are formed. In this case, the first lower electrode may be formed on the substrate 100, and the second lower electrode may be formed on the first lower electrode. In addition, when an insulating layer is formed on the substrate 100, the first lower electrode may be formed on the insulating layer or within the insulating layer. In this case, the first lower electrode may be connected to the selection element formed on the substrate 100. The lower electrode 110 may be formed of a polycrystalline conductive material. That is, the first and second lower electrodes may each be formed of a conductive material having a BCC structure. For example, the first lower electrode may be formed of a metal such as tungsten (W), and the second lower electrode may be formed of a metal nitride such as a titanium nitride (TiN) film.

The first buffer layer 120 is formed on the upper part of the lower electrode 110. The first buffer layer 120 may be formed of a material having excellent compatibility with the lower electrode 110 to eliminate lattice constant mismatch between the lower electrode 110 and the seed layer 130. For example, when the lower electrode 110 or the second lower electrode is formed of TiN, the first buffer layer 120 may be formed using tantalum (Ta) having excellent lattice compatibility with TiN. In this case, Ta is amorphous, but the lower electrode 110 is polycrystalline. Therefore, the amorphous first buffer layer 120 may grow in the crystal direction of the polycrystalline lower electrode 110, and then crystallinity may be improved by heat treatment. In addition, the first buffer layer 120 may be formed to have a thickness of, for example, 2 nm to 10 nm.

The seed layer 130 is formed on the first buffer layer 120. The seed layer 130 may be formed of a material allowing crystal growth of the SyAF layers 140. That is, the seed layer 130 allows the first and second magnetic layers 141 and 143 of the SyAF layers 140 to grow in a desired crystal direction. For example, the seed layer 130 may be formed of a metal that facilitates crystal growth in the (111) direction of a face-centered cubic (FCC) lattice or the (001) direction of a hexagonal close-packed (HCP) structure. The seed layer 130 may include tantalum (Ta), ruthenium (Ru), titanium (Ti), palladium (Pd), platinum (Pt), magnesium (Mg), cobalt (Co), aluminum (Al), tungsten (W), and alloys thereof. Preferably, the seed layer 130 is formed of platinum (Pt) to have a thickness of 1 nm to 3 nm.

The SyAF layers 140 are formed on the seed layer 130. The SyAF layers 140 serve to fix the magnetization of the pinned layer 160. The SyAF layers 140 include the first magnetic layer 141, the non-magnetic layer 142, and the second magnetic layer 143. That is, in the SyAF layers 140, the first magnetic layer 141 and the second magnetic layer 143 are antiferromagnetically coupled via the non-magnetic layer 142. In this case, the first magnetic layer 141 and the second magnetic layer 143 may have crystals oriented in the FCC (111) direction or the HCP (001) direction. In addition, the magnetization directions of the first and second magnetic layers 141 and 143 are arranged antiparallel. For example, the first magnetic layer 141 may be magnetized in the upward direction (that is, the direction toward the upper electrode 220), and the second magnetic layer 143 may be magnetized in the downward direction (that is, the direction toward the substrate 100). Conversely, the first magnetic layer 141 may be magnetized in the downward direction, and the second magnetic layer 143 may be magnetized in the upward direction. The first magnetic layer 141 and the second magnetic layer 143 may be formed by alternately laminating a magnetic metal and a non-magnetic metal. A single metal selected from the group consisting of iron (Fe), cobalt (Co), and nickel (Ni) or an alloy thereof may be used as the magnetic metal, and a single metal selected from the group consisting of chromium (Cr), platinum (Pt), palladium (Pd), iridium (Jr), rhodium (Rh), ruthenium (Ru), osmium (Os), rhenium (Re), gold (Au), and copper (Cu) or an alloy thereof may be used as the non-magnetic metal. For example, the first magnetic layer 141 and the second magnetic layer 143 may be formed of $[Co/Pd]_n$, $[Co/Pt]_n$, or $[CoFe/Pt]_n$ (wherein n is an integer of 1 or more). In this case, the first magnetic layer 141 may be formed thicker than the second magnetic layer 143. In addition, the first magnetic layer 141 may be formed as a plurality of layers, and the second magnetic layer 143 may be formed as a single layer. That is, the first magnetic layer 141 may be formed to have a structure in which the magnetic metal and the non-magnetic metal are repeatedly laminated a plurality of times, and the second magnetic layer 143 may be formed to have a structure in which the magnetic metal and the non-magnetic metal are laminated once, that is, a single laminated structure. For example, the first and second magnetic layers 141 and 143 may be formed to have the same thickness by laminating the same material a plurality of times. In this case, the number of times of lamination may be larger at the time of forming the first magnetic layer 141 as compared to at the time of forming the second magnetic layer 143. For example, the first magnetic layer 141 may be formed of $[Co/Pt]_6$, that is, may be formed by laminating Co and Pt six times, and the second magnetic layer 143 may be formed of $[Co/Pt]_3$, that is, may be formed by laminating Co and Pt three times. In this case, Co may be laminated to a thickness of 0.3 nm to 0.5 nm. Pt may be laminated thinner than Co, or be laminated to the same thickness as Co. For example, Pt may be laminated to a thickness of 0.2 nm to 0.4 nm. In addition, in the first magnetic layer 141, a Co layer may be further laminated on the $[Co/Pt]_6$ in which Co/Pt is repeatedly laminated. That is, the first magnetic layer 141 may have a structure in which Co is laminated one more time than Pt. In this case, a Co layer located at the top may be formed thicker than Co layers below, and may be formed to have a thickness of 0.5 nm to 0.7 nm. In addition, in the second magnetic layer 143, Co and Pt layers may be further laminated on the lower side of the $[Co/Pt]_3$, and a Co layer may be further laminated on the upper side of the $[Co/Pt]_3$. That is, the second magnetic layer 143 may be formed by laminating Co, Pt, $[Co/Pt]_3$, and Co on the non-magnetic layer 142. In this case, the Co layer on the lower side of the $[Co/Pt]_3$ may be formed to have the same thickness as a Co layer included in the $[Co/Pt]_3$ or may be formed thicker than a Co layer included in the $[Co/Pt]_3$. For example, the Co layer on the lower side of the $[Co/Pt]_3$ may be formed to have a thickness of 0.5 nm to 0.7 nm. In addition, the Pt layer on the lower side of the $[Co/Pt]_3$ may be formed to have the same thickness as Pt included in the $[Co/Pt]_3$, and the Co on the upper side of the $[Co/Pt]_3$ may be formed to have the same thickness as Co included in the $[Co/Pt]_3$. The non-magnetic layer 142 is formed between the first magnetic layer 141 and the second magnetic layer 143 and is formed of a nonmagnetic material that allows the first magnetic layer 141 and the second magnetic layer 143 to be coupled to each other. For example, the non-magnetic layer 142 may be formed of a single metal selected from the group consisting of ruthenium (Ru), rhodium (Rh), osmium (Os), rhenium (Re), and chromium (Cr) or an alloy thereof, preferably ruthenium (Ru). In addition, when the second magnetic layer 143 is formed as a single laminated structure, that is, a single layer, the thickness of the first magnetic layer 141 may also be reduced, thereby reducing the total thickness of the memory device. That is, the magnetization value of the first magnetic layer 141 and the sum of the magnetization values of the second magnetic layer 143 and the pinned layer 160 should be the same with respect to the non-magnetic layer 142. However, when the second magnetic layer 143 is formed by laminating a plurality of times, to make the sum of the magnetization values of the second magnetic layer 143 and the pinned layer 160 equal to the magnetization value of the first magnetic layer 141, the number of times of lamination should be further increased in the case of forming the first magnetic layer 141 as compared with the case of forming the second magnetic layer 143. However, according to the present invention, since the second magnetic layer 143 is formed as a single structure, the number of times of lamination at the time of forming the first magnetic layer 141 may be reduced as compared with conventional cases. As a result, the total thickness of the memory device may be reduced.

The separation layer 150 is formed on the upper part of the SyAF layers 140. The separation layer 150 is formed so that the magnetizations of the SyAF layers 140 and the pinned layer 160 are generated independently of each other. In addition, the separation layer 150 is formed of a material capable of improving the crystallinity of a magnetic tunnel junction including the pinned layer 160, the tunnel barrier 170, and the free layers 180. For example, the separation layer 150 may be formed of a polycrystalline material, that is, a conductive material having a BCC structure, such as tungsten (W). When the separation layer 150 is formed of a polycrystalline material, the crystallinity of the magnetic tunnel junction including the pinned layer 160, the tunnel barrier 170, and the free layers 180, which are formed on the upper part of the separation layer 150, may be improved. That is, when the polycrystalline separation layer 150 is formed, the amorphous magnetic tunnel junction formed on the upper part thereof may grow in the crystal direction of the separation layer 150, and the crystallinity of the magnetic tunnel junction may be improved by heat treatment for perpendicular magnetic anisotropy as compared with conventional cases. In particular, when the separation layer 150 is formed of W, the separation layer 150 is crystallized after heat treatment at a high temperature of 400° C. or more, for example, 400° C. to 500° C., thereby preventing a heterogeneous material from diffusing into the tunnel barrier 170. In addition, the pinned layer 160 and the free layers 180 may be crystallized, thereby maintaining the perpendicular magnetic anisotropy of the magnetic tunnel junction. That is, when the crystallinity of the magnetic tunnel junction is improved, the magnitude of magnetization generated when a magnetic field is applied is increased, and the amount of current flowing through the magnetic tunnel junction in a parallel state is increased. Therefore, application of the magnetic tunnel junction to a memory device may improve the operating speed and reliability of the memory device. In addition, the separation layer 150 may be formed to have a thickness of 0.2 nm to 0.5 nm. In this case, the second magnetic layer 143 of the SyAF layers 140 and the pinned layer 160 must be ferro-coupled to fix the magnetization direction of the pinned layer 160. However, when W is used to form the separation layer 150 having a thickness of more than 0.5 nm, the magnetization direction of the pinned layer 160 is not fixed and has the same magnetization direction as the free layers 180 due to increase in the thickness of the separation layer 150. As a result, the same magnetization direction and other magnetization directions required in an MRAM device do not occur, and thus the MRAM device does not operate as a memory.

The pinned layer 160 is formed on the separation layer 150 and is formed of a ferromagnetic material. In the pinned layer 160, magnetization may be fixed to one direction in a magnetic field within a predetermined range. For example, the magnetization direction may be fixed to a direction extending from the upper part to the lower part. For example, the pinned layer 160 may be formed using a full-Heusler half-metal alloy, an amorphous rare-earth element alloy, a multilayer thin film in which a magnetic metal (ferromagnetic metal) and a non-magnetic metal are alternately laminated, an alloy having an L10 type crystal structure, or a ferromagnetic material such as a cobalt alloy. As the full-Heusler half-metal alloy, CoFeAl and CoFeAlSi may be used. As the amorphous rare-earth element alloy, alloys such as TbFe, TbCo, TbFeCo, DyTbFeCo, and Gd TbCo may be used. In addition, the multilayer thin film in which a magnetic metal and a non-magnetic metal are alternately laminated includes Co/Pt, Co/Pd, CoCr/Pt, Co/Ru, Co/Os, Co/Au, Ni/Cu, CoFeAl/Pd, CoFeAl/Pt, CoFeB/Pd, CoFeB/Pt, and the like. In addition, the alloy having an L10 type crystal structure includes Fe50Pt50, Fe50Pd50, Co50Pt50, Fe30Ni20Pt50, Co30Ni20Pt50, and the like. In addition, the cobalt alloy includes CoCr, CoPt, CoCrPt, CoCrTa, CoCrPtTa, CoCrNb, CoFeB, and the like. Among these materials, the CoFeB single layer may be formed thicker than CoFeB and Co/Pt or Co/Pd of a multilayer structure, and thus the magnetoresistance ratio may be increased. In addition, since CoFeB is easier to etch than metals such as Pt and Pd, the CoFeB single layer is easier to fabricate than a multilayer structure containing Pt or Pd. In addition, CoFeB may have a perpendicular magnetization or a horizontal magnetization by adjusting the thickness thereof. Therefore, according to an embodiment of the present invention, a CoFeB single layer is used to form the pinned layer 160. The CoFeB is formed in an amorphous state, and then heat treatment is performed for texturing in the BCC (100) direction. In addition, the pinned layer 160 may be formed to have a thickness of, for example, 0.5 nm to 1.5 nm.

The tunnel barrier 170 is formed on the pinned layer 160 and separates the pinned layer 160 and the free layers 180. The tunnel barrier 170 allows quantum-mechanical tunneling between the pinned layer 160 and the free layers 180. The tunnel barrier 170 may be formed of magnesium oxide (MgO), aluminum oxide ($Al_2O_3$), silicon oxide ($SiO_2$), tantalum oxide ($Ta_2O_5$), silicon nitride (SiNx), aluminum nitride (AlNx), or the like. In an embodiment of the present invention, polycrystalline magnesium oxide is used as the tunnel barrier 170. After the tunnel barrier 170 is formed of the magnesium oxide, heat treatment is performed for texturing in the BCC (100) direction. In addition, the tunnel barrier 170 may be formed to have the same thickness as the pinned layer 160 or may be formed thicker than the pinned layer 160. For example, the tunnel barrier 170 may be formed to have a thickness of 0.5 nm to 1.5 nm.

The free layers 180 are formed on the tunnel barrier 170. In the free layers 180, the direction of magnetization is not fixed to one direction, but may be switched from one direction to the opposite direction. That is, the magnetization direction of the free layers 180 may be the same (that is, parallel) as or opposite (that is, antiparallel) to the magnetization direction of the pinned layer 160. A magnetic tunnel junction may be utilized as a memory element by mapping information of '0' or '1' to a resistance value which changes depending on the magnetization arrangement of the free layers 180 and the pinned layer 160. For example, when the magnetization direction of the free layers 180 is parallel to that of the pinned layer 160, the resistance value of a magnetic tunnel junction becomes small. In this case, data may be defined as '0'. In addition, when the magnetization direction of the free layers 180 is antiparallel to that of the pinned layer 160, the resistance value of a magnetic tunnel junction becomes large. In this case, data may be defined as '1'. For example, the free layers 180 may be formed of a full-Heusler half-metal alloy, an amorphous rare-earth element alloy, a multilayer thin film in which a magnetic metal and a non-magnetic metal are alternately laminated, or a ferromagnetic material such as an alloy having an L10 type crystal structure. In addition, the free layers 180 may be formed to have a laminated structure in which a first free layer 181, an insertion layer 182, and a second free layer 183 are laminated. That is, the free layers 180 may have a structure in which the first and second free layers 181 and 183 are separated from each other in the vertical direction by the insertion layer 182. In this case, the magnetization directions of the first and second free layers 181 and 183 may be the same or different. For example, both the first and second free layers 181 and 183 may have perpendicular magnetization, or the first free layer 181 may have perpendicular magnetization and the second free layer 183 may have horizontal magnetization. In addition, the insertion layer 182 may be formed of a material having a BCC structure without magnetization. That is, the first free layer 181 may be perpendicularly magnetized, the insertion layer 182 may not be magnetized, and the second free layer 183 may be perpendicularly or horizontally magnetized. In this case, each of the first and second free layers 181 and 183 may be formed of CoFeB, and the first free layer 181 may be formed thinner than the second free layer 183 or may be formed to have the same thickness as the second free layer 183. In addition, the insertion layer 182 may be formed thinner than the first or second free layer 181 or 183. For example, each of the first and second free layers 181 and 183 may be formed to have a thickness of 0.5 nm to 1.5 nm using CoFeB, and the insertion layer 182 may be formed to have a thickness of 0.2 nm to 0.5 nm using a material having a BCC structure, e.g., W. In this case, each of the first and second free layers 181 and 183 may be formed to have the same thickness as the pinned layer 160 or may be formed thinner than the pinned layer 160, and the total thickness of the free layers 180 may be greater than the thickness of the pinned layer 160. In addition, the first free layer 181 may further include Fe to increase perpendicular magnetization.

That is, the first free layer 181 may be formed by laminating Fe and CoFeB. In this case, an Fe layer may be formed to have a smaller thickness than that of a CoFeB layer. For example, the Fe layer may be formed to have a thickness of 0.3 nm to 0.5 nm.

The second buffer layer 190 is formed on the free layers 180. The second buffer layer 190 may be formed of magnesium oxide (MgO), aluminum oxide ($Al_2O_3$), silicon oxide ($SiO_2$), tantalum oxide ($Ta_2O_5$), or the like. That is, the second buffer layer 190 may be formed of an oxide. In an embodiment of the present invention, the second buffer layer 190 is formed using polycrystalline magnesium oxide. The second buffer layer 190 is formed so that the free layers 180 have perpendicular magnetic properties. That is, oxygen present in the second buffer layer 190 diffuses into the free layers 180 and bonds with a material in the free layers 180, which causes the free layers 180 to have perpendicular magnetic properties. In addition, the second buffer layer 190 may be formed to have a thickness of, for example, 0.8 nm to 1.2 nm.

The diffusion barrier 200 is formed on the second buffer layer 190. The diffusion barrier 200 is formed to prevent diffusion of the constituent material of the capping layer 210 formed on the diffusion barrier 200. That is, when subsequent processes such as a passivation process and a metal line process are performed, the constituent material, e.g., tungsten, of the capping layer 210 may diffuse into a magnetic tunnel junction positioned therebelow. When tungsten diffuses into the magnetic tunnel junction, the perpendicular magnetic properties of the magnetic tunnel junction are deformed, thereby deteriorating the characteristics of the device. To prevent diffusion of the material of the capping layer 210, the diffusion barrier 200 is formed between the second buffer layer 190 and the capping layer 210. The diffusion barrier 200 may be formed of a material having a smaller atomic radius than tungsten. For example, the diffusion barrier 200 may be formed of Fe, Cr, Mo, V, or the like, preferably Fe. In addition, the diffusion barrier 200 may be formed to have a thickness of, for example, 0.1 nm to 0.7 nm. However, when the diffusion barrier 200 is formed to have a thickness of more than 0.7 nm, that is, is formed thick, using Fe, the diffusion barrier 200 may exhibit horizontal magnetic properties due to Fe having magnetic properties. That is, when the diffusion barrier 200 is formed thick using Fe, the free layers 180 of the magnetic tunnel junction may have horizontal magnetic properties instead of perpendicular magnetic properties. In addition, when the diffusion barrier 200 is formed thin, the effect of preventing diffusion of a material present in the capping layer 210 may be reduced. Therefore, to prevent diffusion of the material of the capping layer 210 and to prevent the magnetic tunnel junction from exhibiting horizontal magnetic properties, the diffusion barrier 200 may be formed to have a thickness within a certain range. For example, the diffusion barrier 200 may be formed to have a thickness of 0.1 nm to 0.7 nm.

The capping layer 210 is formed on the diffusion barrier 200. The capping layer 210 may be formed of a polycrystalline material, for example, a conductive material having a BCC structure. For example, the capping layer 210 may be formed of tungsten (W). When the capping layer 210 is formed of a polycrystalline material, the crystallinity of the magnetic tunnel junction formed under the capping layer 210 may be improved. That is, when an amorphous magnetic tunnel junction is formed on the separation layer 150 having a BCC structure, the amorphous magnetic tunnel junction grows in the crystal direction of the separation layer 150, and the capping layer 210 having a BCC structure is formed on the magnetic tunnel junction. When heat treatment is subsequently performed, the crystallinity of the magnetic tunnel junction may be further improved. In addition, the capping layer 210 serves to prevent diffusion of the upper electrode 220. The capping layer 210 may be formed to have a thickness of, for example, 1 nm to 4 nm.

The upper electrode 220 is formed on the capping layer 210. The upper electrode 220 may be formed of a conductive material such as a metal, a metal oxide, and a metal nitride. For example, the upper electrode 220 may be formed of a single metal selected from the group consisting of tantalum (Ta), ruthenium (Ru), titanium (Ti), palladium (Pd), platinum (Pt), magnesium (Mg), and aluminum (Al) or an alloy thereof.

As described above, in the memory device according to the embodiments of the present invention, the lower electrode 110 is formed of a polycrystalline material, the SyAF layers 140 are formed on the upper part thereof, and then a magnetic tunnel junction is formed. Therefore, since the FCC (111) structure of the SyAF layers 140 does not diffuse into the magnetic tunnel junction, the BCC (100) crystal structure of the magnetic tunnel junction may be preserved, and the magnetization direction of the magnetic tunnel junction may be rapidly changed, thereby increasing the operating speed of a memory. In addition, diffusion of the capping layer 210 may be prevented by forming the diffusion barrier 200 between the second buffer layer 190 and the capping layer 210 on the magnetic tunnel junction. That is, since the diffusion barrier 200 is formed between the magnetic tunnel junction and the capping layer 210, it is possible to prevent the constituent material of the capping layer 210 from diffusing to the magnetic tunnel junction side in subsequent processes. As a result, normal operation of the magnetic tunnel junction may be ensured and the operation reliability of the memory device may be improved.

Figure 2:
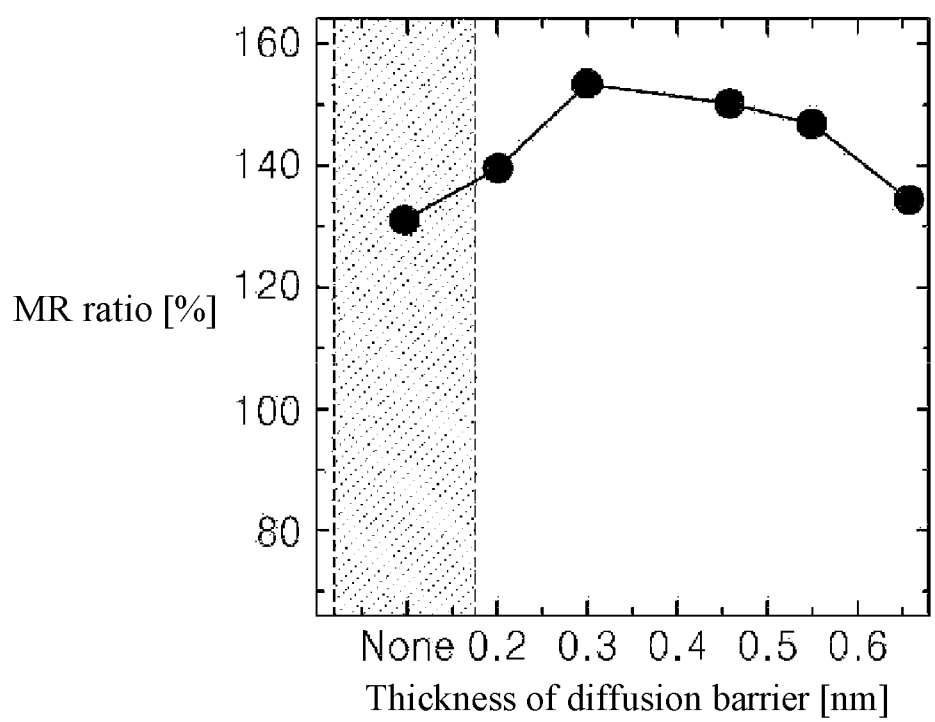
FIG. 2 is a graph showing tunnel magnetoresistance ratios depending on the thicknesses of the diffusion barrier of a memory device according to a comparative example or a memory device according to an embodiment of the present invention.

FIG. 2 is a graph showing the tunnel magnetoresistance (TMR) ratios depending on the thicknesses of a diffusion barrier. That is, FIG. 2 is a graph showing the magnetoresistance ratios of a memory device according to a comparative example in which a diffusion barrier is not formed or a memory device according to an embodiment of the present invention in which a diffusion barrier having a thickness of 0.2 nm to 0.7 nm is formed. At this time, in the conventional example and the embodiment of the present invention, the structure and the thickness are the same, but in the embodiment of the present invention, a diffusion barrier is further formed as compared with the convention example. As shown in FIG. 2, when the diffusion barrier is formed, the magnetoresistance ratio increases until the thickness of the diffusion barrier becomes 0.3 nm, but the magnetoresistance ratio begins to decrease when the thickness exceeds 0.3 nm and gradually decreases until the thickness is 0.7 nm. It can be seen that the magnetoresistance ratio exhibits the maximum value (153%) when the thickness of the diffusion barrier is 0.3 nm. However, even when the thickness of the diffusion barrier is 0.2 nm or more and less than 0.3 nm, or the thickness of the diffusion barrier is more than 0.3 nm and 0.7 nm or less, the magnetoresistance ratio increases as compared with the comparative example in which no diffusion barrier is formed. Meanwhile, the TMR ratio was measured using a current-in-plane tunneling (CiPT) instrument. In the CiPT measuring method, two probes are bonded on a thin upper electrode, and the spacing between the two probes is measured and distinguished by a few micrometers. At this time, in the instrument, the TMR ratio is calculated by fitting the resistances between the thin upper electrode measured at intervals of several micrometers and the thick lower electrode.

Figure 3A:
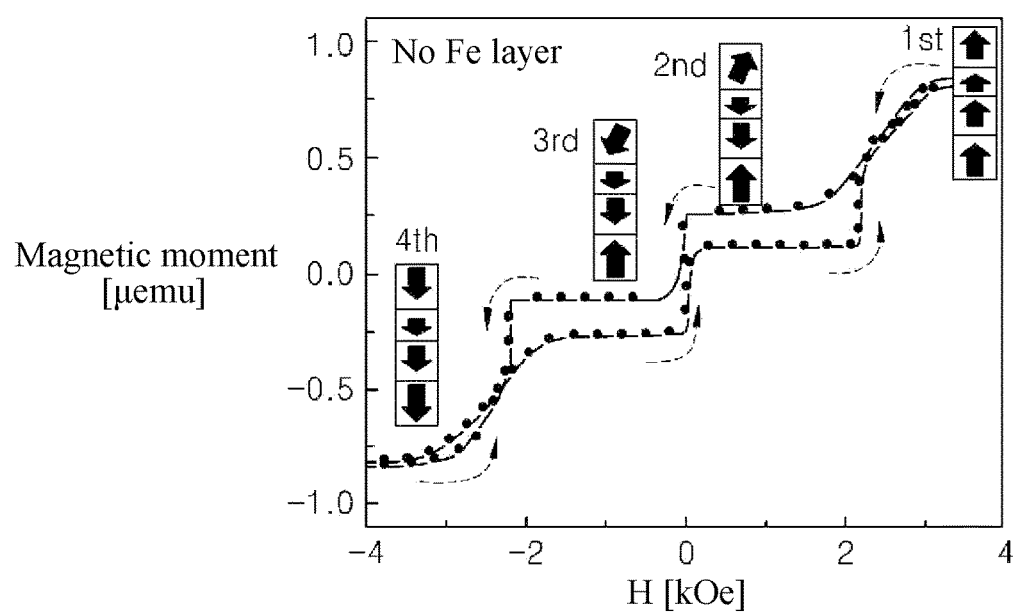
FIGS. 3A to 4B are graphs showing the magnetic properties of a memory device according to a comparative example and a memory device according to an embodiment of the present invention.
Figure 3B:
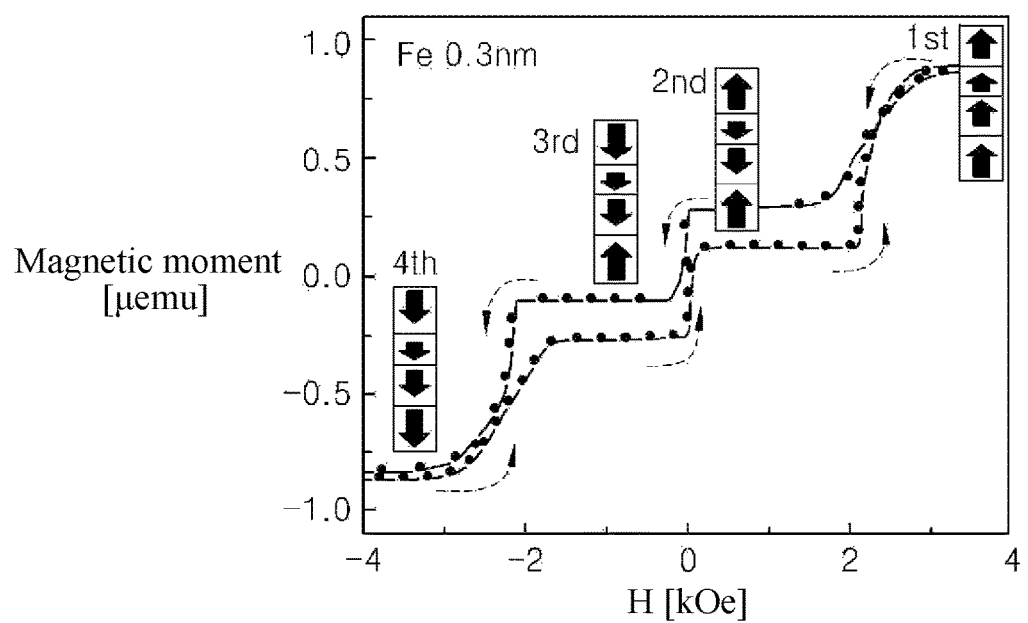
Figure 4A:
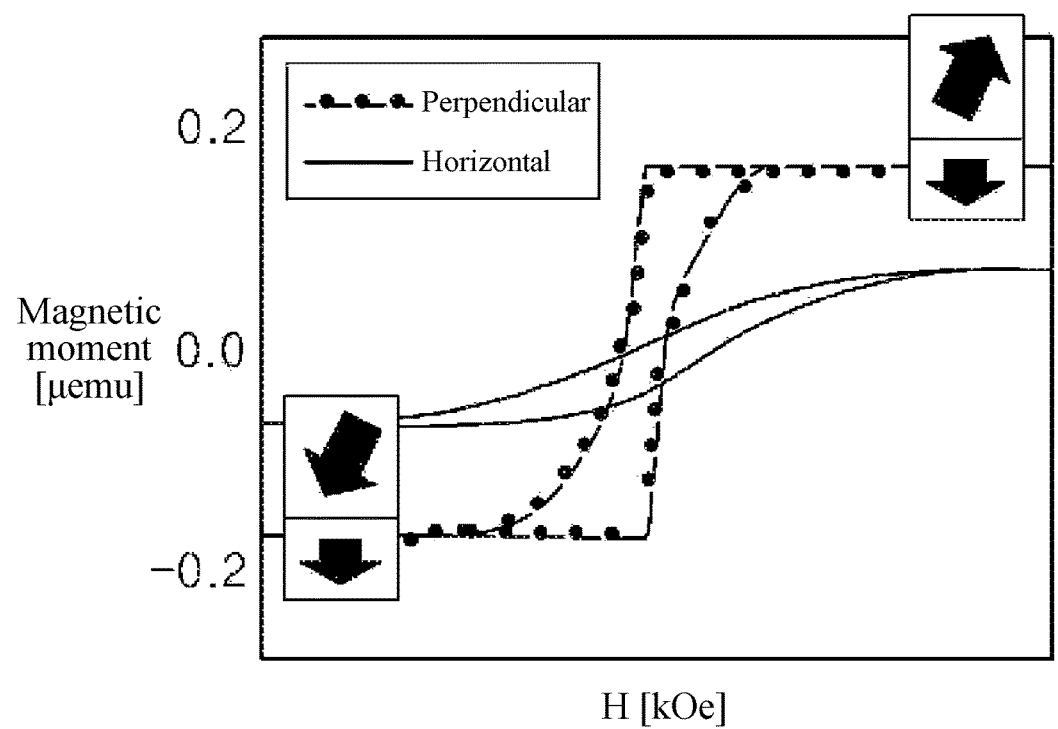
Figure 4B:
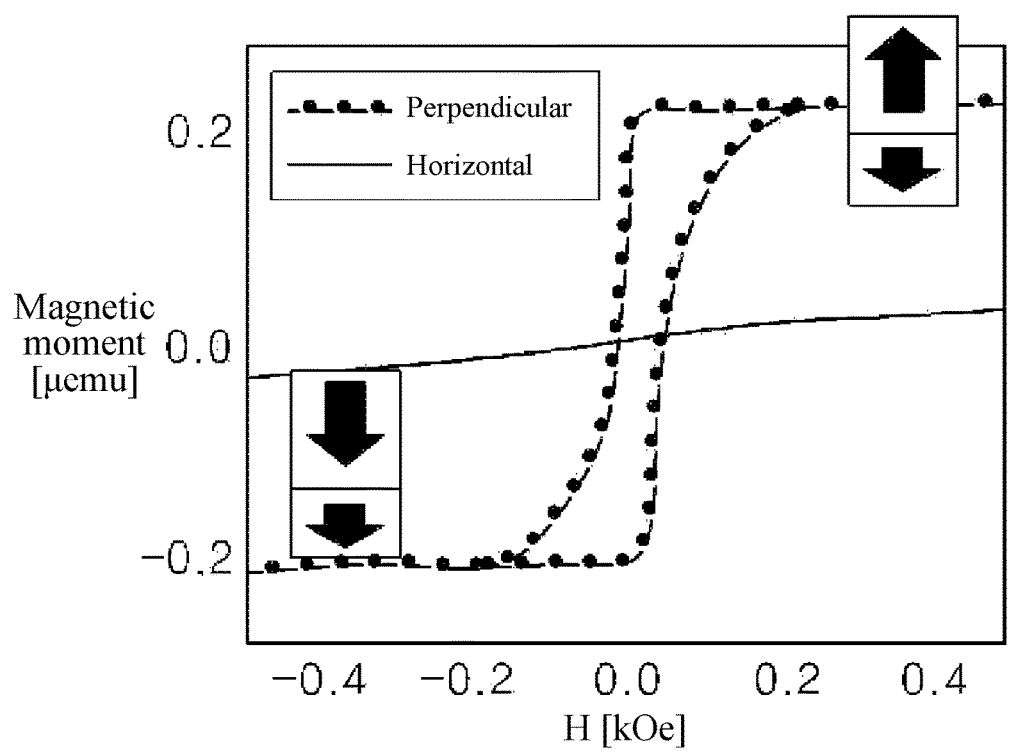

FIGS. 3A to 4B are graphs showing the magnetic properties of a memory device according to a comparative example and a memory device according to an embodiment of the present invention. That is, FIGS. 3A and 4A are graphs showing the magnetic properties of a magnetic tunnel junction and free layers according to a comparative example in which a diffusion barrier is not formed, and FIGS. 3B and 4B are graphs showing the magnetic properties of a magnetic tunnel junction and free layers according to an embodiment of the present invention in which a diffusion barrier is formed. In FIGS. 3A and 4A, the arrows in the graphs represent the magnetic directions of the first and second magnetic layers of the SyAF layers, the pinned layer, and the free layers, respectively, (from the lower side to the upper side). In FIGS. 3B and 4B, the arrows represent perpendicular magnetic anisotropy and horizontal magnetic anisotropy. As shown in FIG. 4A, in the case of the embodiment of the present invention, it can be seen that the free layers maintain coercive force and squareness as in the comparative example shown in FIG. 3A. In addition, as shown in FIG. 3B, the free layers of the comparative example have a perpendicular magnetization degree of 165 µemu and a horizontal magnetization degree of 73 µemu. That is, the free layers of the comparative example exhibit both perpendicular and horizontal magnetic anisotropy. However, as shown in FIG. 4B, the free layers of the embodiment of the present invention have a perpendicular magnetization degree of 217 µemu, and in the case of the horizontal magnetization degree, only magnetization degree of 29 µemu is shown without horizontal magnetic anisotropy. Therefore, a diffusion barrier is formed using Fe, perpendicular magnetic anisotropy is improved, and horizontal magnetic anisotropy, which interferes with perpendicular magnetic anisotropy, disappears.

Figure 5:
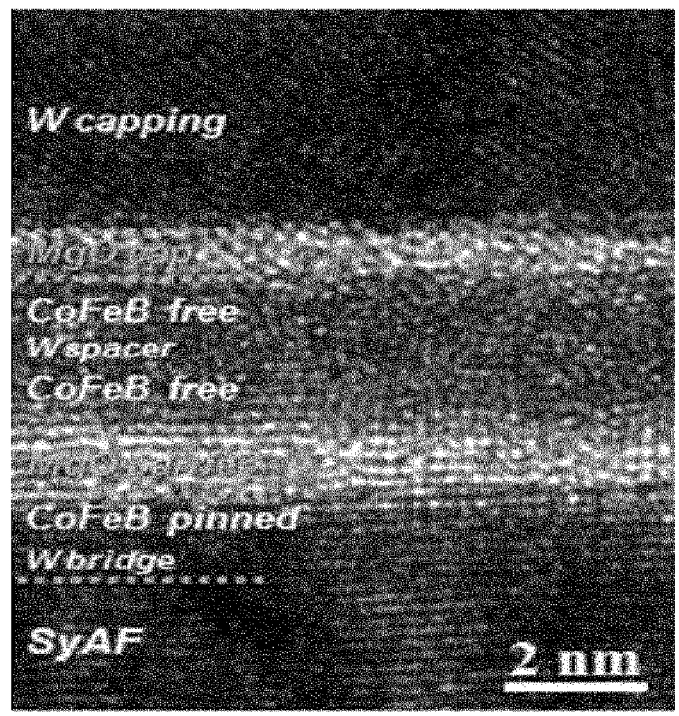
FIGS. 5 and 6 are TEM images showing a memory device according to a comparative example and a memory device according to an embodiment of the present invention, respectively.
Figure 6:
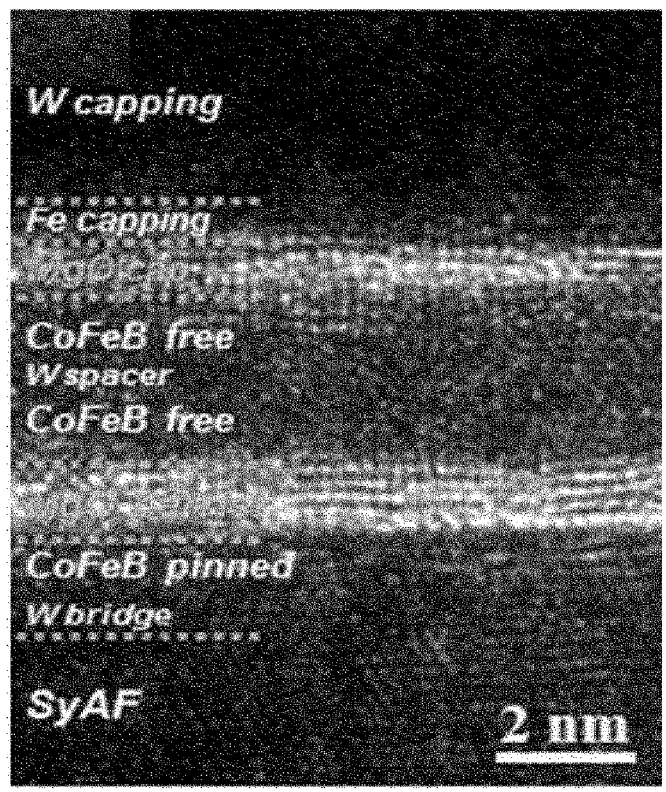

FIGS. 5 and 6 are TEM images showing a memory device according to a comparative example and a memory device according to an embodiment of the present invention, respectively. That is, FIG. 5 is a TEM image of a memory device according to a comparative example in which a diffusion barrier is not formed, and FIG. 6 is a TEM image of a memory device according to an embodiment of the present invention in which a diffusion barrier having a thickness of 0.3 nm is formed. As shown in FIG. 5, in the memory device according to the comparative example, synthetic antiferromagnetic layers (SyAF), a W separation layer, a CoFeB pinned layer, a MgO tunnel barrier, a CoFeB first free layer, a W insertion layer, a CoFeB second free layer, a MgO buffer layer, and a W capping layer are laminated in the order from bottom to top. As shown in FIG. 6, the memory device according to the embodiment of the present invention is formed in the same manner as the memory device of the comparative example (FIG. 5), but in the case of the memory device according to the embodiment of the present invention, an Fe diffusion barrier is further formed between the MgO buffer layer and the W capping layer. As shown in FIG. 5, in case of the comparative example without the Fe diffusion barrier, the MgO buffer layer is amorphized. In contrast, as shown in FIG. 6, in the case of the embodiment with the Fe diffusion barrier having a thickness of 0.3 nm, the MgO buffer layer is uniformly crystallized.

Figure 7:
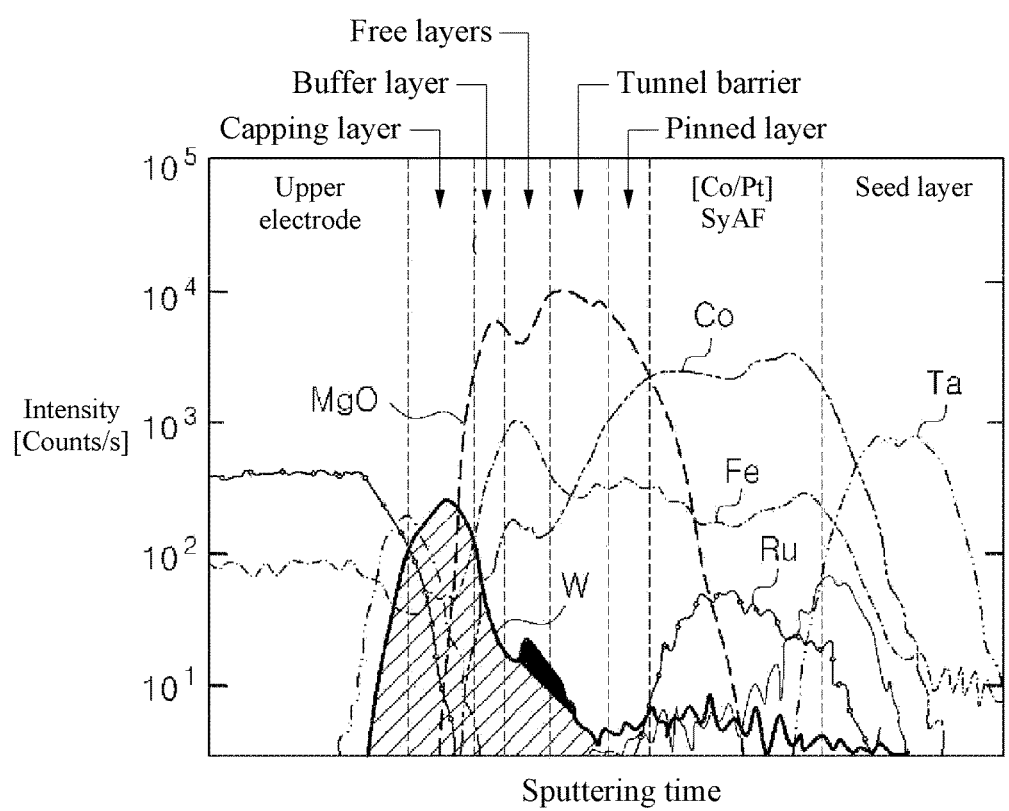
FIGS. 7 and 8 are graphs showing the ion diffusion distribution of a memory device according to a comparative example and a memory device according to an embodiment of the present invention, respectively.
Figure 8:
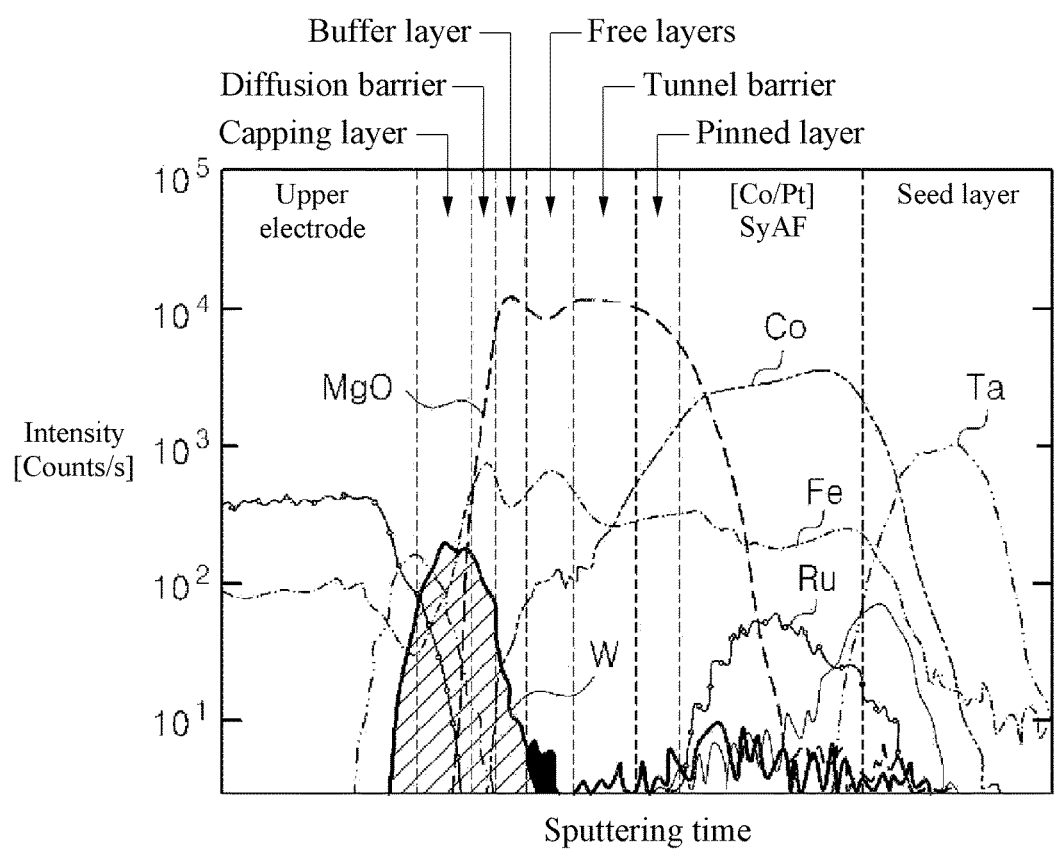

FIGS. 7 and 8 are graphs of secondary ion mass spectroscopy (SIMS) results showing the ion diffusion distribution of a memory device according to a comparative example and a memory device according to an embodiment of the present invention, respectively. As shown in FIG. 7, when a diffusion barrier is not formed, W atoms of a capping layer diffuse to a magnetic tunnel junction. As shown in FIG. 8, when an Fe diffusion barrier is formed, diffusion of W of a capping layer to a magnetic tunnel junction is prevented by the presence of the diffusion barrier. Therefore, compared with the memory device according to the comparative example, the memory device of the present invention is capable of preventing diffusion of a material forming a capping layer, thereby increasing the tunnel magnetoresistance ratio.

Hereinafter, a memory device according to another embodiment of the present invention will be described with reference to FIGS. 9 to 11.

Figure 9:
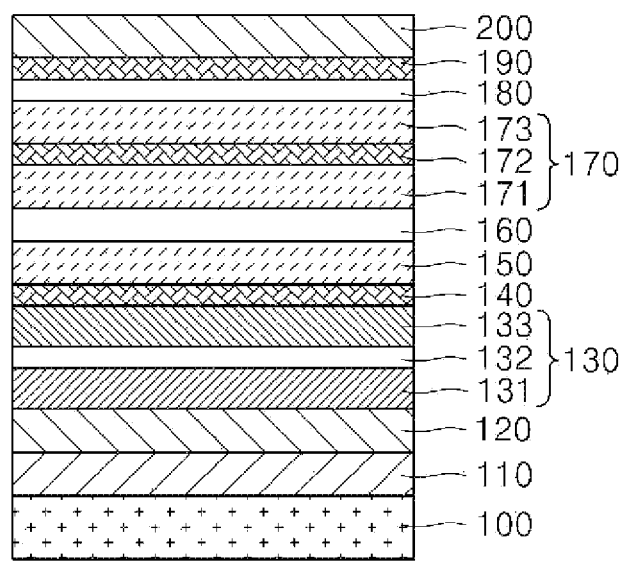
FIG. 9 is a cross-sectional view of a memory device according to one embodiment of the present invention.

FIG. 9 is a cross-sectional view of a memory device according to one embodiment of the present invention, that is, a cross-sectional view of an STT-MRAM device.

Referring to FIG. 9, a memory device according to one embodiment of the present invention includes a lower electrode 110, a seed layer 120, SyAF layers 130, a separation layer 140, a pinned layer 150, a tunnel barrier 160, free layers 170, a buffer layer 180, a capping layer 190, and an upper electrode 200, which are formed on a substrate 100. In this case, the SyAF layers 130 are formed by laminating a first magnetic layer 131, a non-magnetic layer 132, and a second magnetic layer 133, and the pinned layer 150, the tunnel barrier 160, and the free layers 170 form a magnetic tunnel junction. That is, in the memory device according to the present invention, the SyAF layers 130 are first formed on the substrate 100, and then the magnetic tunnel junction is formed thereon.

The substrate 100 may be a semiconductor substrate. For example, as the substrate 100, a silicon substrate, a gallium arsenide substrate, a silicon germanium substrate, a silicon oxide film substrate, or the like may be used. In this embodiment, a silicon substrate is used. In addition, a selection element including a transistor may be formed on the substrate 100. In addition, an insulating layer (not shown) may be formed on the substrate 100. That is, the insulating layer may be formed to cover predetermined structures such as a selection element, and may be provided with a contact hole exposing at least a part of the selection element. The insulating layer may be formed using a silicon oxide ($SiO_2$) film having an amorphous structure.

The lower electrode 110 is formed on the substrate 100. The lower electrode 110 may be formed using conductive materials, such as metals and metal nitrides. In addition, the lower electrode 110 of the present invention may be formed as at least one layer. That is, the lower electrode 110 may be formed as a single layer or as two or more layers. When the lower electrode 110 is formed as a single layer, the lower electrode 110 may be formed of a metal nitride, such as a titanium nitride (TiN) film. In addition, the lower electrode 110 may be formed as a dual structure in which first and second lower electrodes are formed. In this case, the first lower electrode may be formed on the substrate 100, and the second lower electrode may be formed on the first lower electrode. In addition, when an insulating layer is formed on the substrate 100, the first lower electrode may be formed on the insulating layer or within the insulating layer. In this case, the first lower electrode may be connected to the selection element formed on the substrate 100. The lower electrode 110 may be formed of a polycrystalline conductive material. That is, the first and second lower electrodes may each be formed of a conductive material having a BCC structure. For example, the first lower electrode may be formed of a metal such as tungsten (W), and the second lower electrode may be formed of a metal nitride such as a titanium nitride (TiN) film. In addition, a buffer layer (not shown) may be formed on the lower electrode 110 to eliminate lattice constant mismatch between the lower electrode 110 and the seed layer 120. The buffer layer may be formed of a material having excellent compatibility with the lower electrode 110. For example, when the lower electrode 110 or the second lower electrode is formed of TiN, the buffer layer may be formed using tantalum (Ta) having excellent lattice compatibility with TiN. In this case, Ta is amorphous, but the lower electrode 110 is polycrystalline. Therefore, the amorphous buffer layer may grow in the crystal direction of the polycrystalline lower electrode 110, and then crystallinity may be improved by heat treatment.

The seed layer 120 is formed on the lower electrode 110. In this case, when the buffer layer 180 is formed on the lower electrode 110, the seed layer 120 is formed on the buffer layer 180. The seed layer 120 may be formed of a material allowing crystal growth of the SyAF layers 130. That is, the seed layer 120 allows the first and second magnetic layers 131 and 133 of the SyAF layers 130 to grow in a desired crystal direction. For example, the seed layer 120 may be formed of a metal that facilitates crystal growth in the (111) direction of a face-centered cubic (FCC) lattice or the (001) direction of a hexagonal close-packed (HCP) structure. The seed layer 120 may be formed of a metal selected from the group consisting of titanium (Ti), palladium (Pd), platinum (Pt), magnesium (Mg), cobalt (Co), aluminum (Al), and tungsten (W) or an alloy thereof. Preferably, the seed layer 120 is formed of platinum (Pt), and is formed to have a thickness of 1 nm to 8 nm. When the seed layer 120 is formed using platinum, the magnetoresistance ratio may be maintained at a value of 60% to 140%. Preferably, when the seed layer 120 is formed to have a thickness of 3 nm to 5 nm using platinum, the magnetoresistance ratio may be maintained at a value of 120% to 140%.

The SyAF layers 130 are formed on the seed layer 120. The SyAF layers 130 serve to fix the magnetization of the pinned layer 150. The SyAF layers 130 include the first magnetic layer 131, the non-magnetic layer 132, and the second magnetic layer 133. That is, in the SyAF layers 130, the first magnetic layer 131 and the second magnetic layer 133 are antiferromagnetically coupled via the non-magnetic layer 132. In this case, the first magnetic layer 131 and the second magnetic layer 133 may have crystals oriented in the FCC (111) direction or the HCP (001) direction. In addition, the magnetization directions of the first and second magnetic layers 131 and 133 are arranged antiparallel. For example, the first magnetic layer 131 may be magnetized in the upward direction (that is, the direction toward the upper electrode 200), and the second magnetic layer 133 may be magnetized in the downward direction (that is, the direction toward the substrate 100). Conversely, the first magnetic layer 131 may be magnetized in the downward direction, and the second magnetic layer 133 may be magnetized in the upward direction. The first magnetic layer 131 and the second magnetic layer 133 may be formed by alternately laminating a magnetic metal and a non-magnetic metal. A single metal selected from the group consisting of iron (Fe), cobalt (Co), and nickel (Ni) or an alloy thereof may be used as the magnetic metal, and a single metal selected from the group consisting of chromium (Cr), platinum (Pt), palladium (Pd), iridium (Jr), rhodium (Rh), ruthenium (Ru), osmium (Os), rhenium (Re), gold (Au), and copper (Cu) or an alloy thereof may be used as the non-magnetic metal. For example, the first magnetic layer 131 and the second magnetic layer 133 may be formed of $[Co/Pd]_n$, $[Co/Pt]_n$, or $[CoFe/Pt]_n$ (wherein n is an integer of 1 or more). In this case, the first magnetic layer 131 may be formed thicker than the second magnetic layer 133. In addition, the first magnetic layer 131 may be formed as a plurality of layers, and the second magnetic layer 133 may be formed as a single layer. That is, the first magnetic layer 131 may be formed to have a structure in which the magnetic metal and the non-magnetic metal are repeatedly laminated a plurality of times, and the second magnetic layer 133 may be formed to have a structure in which the magnetic metal and the non-magnetic metal are laminated once, that is, a single laminated structure. For example, the first and second magnetic layers 131 and 133 may be formed to have the same thickness by laminating the same material a plurality of times. In this case, the number of times of lamination may be larger at the time of forming the first magnetic layer 131 as compared to at the time of forming the second magnetic layer 133. For example, the first magnetic layer 131 may be formed of $[Co/Pt]_6$, that is, may be formed by laminating Co and Pt six times, and the second magnetic layer 133 may be formed of $[Co/Pt]_3$, that is, may be formed by laminating Co and Pt three times. In this case, Co may be laminated to a thickness of 0.3 nm to 0.5 nm. Pt may be laminated thinner than Co, or be laminated to the same thickness as Co. For example, Pt may be laminated to a thickness of 0.2 nm to 0.4 nm. The non-magnetic layer 132 is formed between the first magnetic layer 131 and the second magnetic layer 133 and is formed of a nonmagnetic material that allows the first magnetic layer 131 and the second magnetic layer 133 to form diamagnetic coupling with each other. For example, the non-magnetic layer 132 may be formed of a single metal selected from the group consisting of ruthenium (Ru), rhodium (Rh), osmium (Os), rhenium (Re), and chromium (Cr) or an alloy thereof, preferably ruthenium (Ru). In addition, when the second magnetic layer 133 is formed as a single laminated structure, that is, a single layer, the thickness of the first magnetic layer 131 may also be reduced, thereby reducing the total thickness of the memory device. That is, the magnetization value of the first magnetic layer 131 and the sum of the magnetization values of the second magnetic layer 133 and the pinned layer 150 should be the same with respect to the non-magnetic layer 132. However, when the second magnetic layer 133 is formed by laminating a plurality of times, to make the sum of the magnetization values of the second magnetic layer 133 and the pinned layer 150 equal to the magnetization value of the first magnetic layer 131, the number of times of lamination should be further increased in the case of forming the first magnetic layer 131 as compared with the case of forming the second magnetic layer 133. However, according to the present invention, since the second magnetic layer 133 is formed as a single structure, the number of times of lamination at the time of forming the first magnetic layer 131 may be reduced as compared with conventional cases. As a result, the total thickness of the memory device may be reduced.

The separation layer 140 is formed on the upper part of the SyAF layers 130. The separation layer 140 is formed so that the magnetizations of the SyAF layers 130 and the pinned layer 150 are generated independently of each other. In addition, the separation layer 140 is formed of a material capable of improving the crystallinity of a magnetic tunnel junction including the pinned layer 150, the tunnel barrier 160, and the free layers 170. For example, the separation layer 140 may be formed of a polycrystalline material, that is, a conductive material having a BCC structure, such as tungsten (W). When the separation layer 140 is formed of a polycrystalline material, the crystallinity of the magnetic tunnel junction including the pinned layer 150, the tunnel barrier 160, and the free layers 170, which are formed on the upper part of the separation layer 140, may be improved. That is, when the polycrystalline separation layer 140 is formed, the amorphous magnetic tunnel junction formed on the upper part thereof may grow in the crystal direction of the separation layer 140, and the crystallinity of the magnetic tunnel junction may be improved by heat treatment for perpendicular magnetic anisotropy as compared with conventional cases. In particular, when the separation layer 140 is formed of W, the separation layer 140 is crystallized after heat treatment at a high temperature of 400° C. or more, for example, 400° C. to 500° C., thereby preventing a heterogeneous material from diffusing into the tunnel barrier 160. In addition, the pinned layer 150 and the free layers 170 may be crystallized, thereby maintaining the perpendicular magnetic anisotropy of the magnetic tunnel junction. That is, when the crystallinity of the magnetic tunnel junction is improved, the magnitude of magnetization generated when a magnetic field is applied is increased, and the amount of current flowing through the magnetic tunnel junction in a parallel state is increased. Therefore, application of the magnetic tunnel junction to a memory device may improve the operating speed and reliability of the memory device. In addition, the separation layer 140 may be formed to have a thickness of 0.2 nm to 0.5 nm. In this case, the second magnetic layer 133 of the SyAF layers 130 and the pinned layer 150 must be ferro-coupled to fix the magnetization direction of the pinned layer 150. However, when W is used to form the separation layer 140 having a thickness of more than 0.5 nm, the magnetization direction of the pinned layer 150 is not fixed and has the same magnetization direction as the free layers 170 due to increase in the thickness of the separation layer 140. As a result, the same magnetization direction and other magnetization directions required in an MRAM device do not occur, and thus the MRAM device does not operate as a memory.

The pinned layer 150 is formed on the separation layer 140 and is formed of a ferromagnetic material. In the pinned layer 150, magnetization may be fixed to one direction in a magnetic field within a predetermined range. For example, the magnetization direction may be fixed to a direction extending from the upper part to the lower part. For example, the pinned layer 150 may be formed using a full-Heusler half-metal alloy, an amorphous rare-earth element alloy, a multilayer thin film in which a magnetic metal (ferromagnetic metal) and a non-magnetic metal are alternately laminated, an alloy having an L10 type crystal structure, or a ferromagnetic material such as a cobalt alloy. As the full-Heusler half-metal alloy, CoFeAl and CoFeAlSi may be used. As the amorphous rare-earth element alloy, alloys such as TbFe, TbCo, TbFeCo, DyTbFeCo, and Gd TbCo may be used. In addition, the multilayer thin film in which a magnetic metal and a non-magnetic metal are alternately laminated includes Co/Pt, Co/Pd, CoCr/Pt, Co/Ru, Co/Os, Co/Au, Ni/Cu, CoFeAl/Pd, CoFeAl/Pt, CoFeB/Pd, CoFeB/Pt, and the like. In addition, the alloy having an L10 type crystal structure includes Fe50Pt50, Fe50Pd50, Co50Pt50, Fe30Ni20Pt50, Co30Ni20Pt50, and the like. In addition, the cobalt alloy includes CoCr, CoPt, CoCrPt, CoCrTa, CoCrPtTa, CoCrNb, CoFeB, and the like. Among these materials, the CoFeB single layer may be formed thicker than CoFeB and Co/Pt or Co/Pd of a multilayer structure, and thus the magnetoresistance ratio may be increased. In addition, since CoFeB is easier to etch than metals such as Pt and Pd, the CoFeB single layer is easier to fabricate than a multilayer structure containing Pt or Pd. In addition, CoFeB may have a perpendicular magnetization or a horizontal magnetization by adjusting the thickness thereof. Therefore, according to an embodiment of the present invention, a CoFeB single layer is used to form the pinned layer 150. The CoFeB is formed in an amorphous state, and then heat treatment is performed for texturing in the BCC (100) direction.

The tunnel barrier 160 is formed on the pinned layer 150 and separates the pinned layer 150 and the free layers 170. The tunnel barrier 160 allows quantum-mechanical tunneling between the pinned layer 150 and the free layers 170. The tunnel barrier 160 may be formed of magnesium oxide (MgO), aluminum oxide ($Al_2O_3$), silicon oxide ($SiO_2$), tantalum oxide ($Ta_2O_5$), silicon nitride (SiNx), aluminum nitride (AlNx), or the like. In an embodiment of the present invention, polycrystalline magnesium oxide is used as the tunnel barrier 160. After the tunnel barrier 160 is formed of the magnesium oxide, heat treatment is performed for texturing in the BCC (100) direction.

The free layers 170 are formed on the tunnel barrier 160. In the free layers 170, the direction of magnetization is not fixed to one direction, but may be switched from one direction to the opposite direction. That is, the magnetization direction of the free layers 170 may be the same (that is, parallel) as or opposite (that is, antiparallel) to the magnetization direction of the pinned layer 150. A magnetic tunnel junction may be utilized as a memory element by mapping information of '0' or '1' to a resistance value which changes depending on the magnetization arrangement of the free layers 170 and the pinned layer 150. For example, when the magnetization direction of the free layers 170 is parallel to that of the pinned layer 150, the resistance value of a magnetic tunnel junction becomes small. In this case, data may be defined as '0'. In addition, when the magnetization direction of the free layers 170 is antiparallel to that of the pinned layer 150, the resistance value of a magnetic tunnel junction becomes large. In this case, data may be defined as '1'. For example, the free layers 170 may be formed of a full-Heusler half-metal alloy, an amorphous rare-earth element alloy, a multilayer thin film in which a magnetic metal and a non-magnetic metal are alternately laminated, or a ferromagnetic material such as an alloy having an L10 type crystal structure. In addition, the free layers 170 may be formed to have a laminated structure in which a first free layer 171, an insertion layer 172, and a second free layer 173 are laminated. That is, the free layers 170 may have a structure in which the first and second free layers 171 and 173 are separated from each other in the vertical direction by the insertion layer 172. In this case, the magnetization directions of the first and second free layers 171 and 173 may be the same or different. For example, both the first and second free layers 171 and 173 may have perpendicular magnetization, or the first free layer 171 may have perpendicular magnetization and the second free layer 173 may have horizontal magnetization. In addition, the insertion layer 172 may be formed of a material having a BCC structure without magnetization. That is, the first free layer 171 may be perpendicularly magnetized, the insertion layer 172 may not be magnetized, and the second free layer 173 may be perpendicularly or horizontally magnetized. In this case, each of the first and second free layers 171 and 173 may be formed of CoFeB, and the first free layer 171 may be formed thinner than the second free layer 173 or may be formed to have the same thickness as the second free layer 173. In addition, the insertion layer 172 may be formed thinner than the first or second free layer 171 or 173. For example, each of the first and second free layers 171 and 173 may be formed to have a thickness of 0.5 nm to 1.5 nm using CoFeB, and the insertion layer 172 may be formed to have a thickness of 0.2 nm to 0.5 nm using a material having a BCC structure, e.g., W.

The buffer layer 180 is formed on the free layers 170. The buffer layer 180 may be formed of magnesium oxide (MgO), aluminum oxide ($Al_2O_3$), silicon oxide ($SiO_2$), tantalum oxide ($Ta_2O_5$), or the like. That is, the buffer layer 180 may be formed of an oxide. In an embodiment of the present invention, the buffer layer 180 is formed using polycrystalline magnesium oxide. The buffer layer 180 is formed so that the free layers 170 have perpendicular magnetic properties. That is, oxygen present in the second buffer layer 180 diffuses into the free layers 170 and bonds with a material in the free layers 170, which causes the free layers 170 to have perpendicular magnetic properties. In addition, the buffer layer 180 may be formed to have a thickness of, for example, 0.8 nm to 1.2 nm.

The capping layer 190 is formed on the buffer layer 180. The capping layer 190 is formed of a polycrystalline material, for example, a conductive material having a BCC structure. For example, the capping layer 190 may be formed of tungsten (W). When the capping layer 190 is formed of a polycrystalline material, the crystallinity of the magnetic tunnel junction formed under the capping layer 190 may be improved. That is, when an amorphous magnetic tunnel junction is formed on the separation layer 140 having a BCC structure, the amorphous magnetic tunnel junction grows in the crystal direction of the separation layer 140, and the capping layer 190 having a BCC structure is formed on the magnetic tunnel junction. When heat treatment is subsequently performed, the crystallinity of the magnetic tunnel junction may be further improved. In addition, the capping layer 190 serves to prevent diffusion of the upper electrode 200. The capping layer 190 may be formed to have a thickness of, for example, 1 nm to 6 nm.

The upper electrode 200 is formed on the capping layer 190. The upper electrode 200 may be formed of a conductive material such as a metal, a metal oxide, and a metal nitride. For example, the upper electrode 200 may be formed of a single metal selected from the group consisting of tantalum (Ta), ruthenium (Ru), titanium (Ti), palladium (Pd), platinum (Pt), magnesium (Mg), and aluminum (Al) or an alloy thereof.

As described above, in the memory device according to the embodiments of the present invention, the lower electrode 110 is formed of a polycrystalline material, the SyAF layers 130 are formed thereon, and then a magnetic tunnel junction is formed. Therefore, since the FCC (111) structure of the SyAF layers 130 does not diffuse into the magnetic tunnel junction, the BCC (100) crystal structure of the magnetic tunnel junction may be preserved. As a result, the magnetization direction of the magnetic tunnel junction may be rapidly changed, thereby improving the operating speed of the memory device. In addition, in the memory device of the present invention, since the seed layer 120 is formed of a material including platinum (Pt), growth of the SyAF layers 130 in the FCC (111) direction may be promoted, and the magnetization of the pinned layer 150 may be fixed in the perpendicular direction. Therefore, a high magnetoresistance ratio may be realized as compared with a conventional case.

Figure 10:
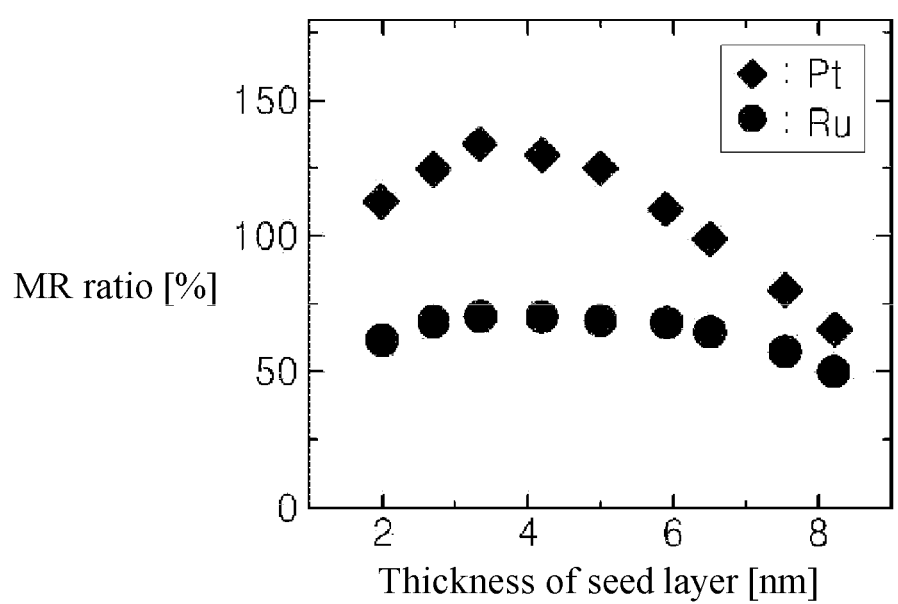
FIG. 10 is a graph showing the magnetoresistance ratios of a memory device according to a comparative example and a memory device according to an embodiment of the present invention depending on the thicknesses of a seed layer.

FIG. 10 is a graph showing the magnetoresistance ratios of a memory device according to a comparative example and a memory device according to an embodiment of the present invention depending on the thicknesses of a seed layer. That is, in the case of a memory device according a comparative example, a lower electrode, a seed layer, SyAF layers, a separation layer, a magnetic tunnel junction, a buffer layer, a capping layer, and an upper electrode were laminated on a substrate, and free layers included in the magnetic tunnel junction were formed to have a structure in which an insertion layer was formed between first and second free layers, and the seed layer was formed of Ru. On the other hand, a memory device according to an embodiment of the present invention was fabricated in the same manner as in the comparative example except that the seed layer was formed of Pt. After the devices were fabricated, the magnetoresistance ratios were measured depending on change of the seed layer thickness (2 nm to 8 nm). The results are shown in FIG. 10. Specifically, in the comparative example and the embodiment of the present invention, the magnetoresistance ratios were measured after the laminated structures were heat-treated at 400° C. In the case of the comparative example, in which the seed layer was formed using Ru, magnetoresistance ratios of 50% to 70% were maintained at thicknesses of 2 nm to 8 nm. However, in the case of the embodiment, in which the seed layer was formed using Pt, magnetoresistance ratios of 65% to 134% were maintained at thicknesses of 2 nm to 8 nm. That is, the magnetoresistance ratio in the case of using Pt as the seed layer was higher than that in the case of using Ru as the seed layer. In particular, when the seed layer was formed to have a thickness of 3 nm to 5 nm using Pt, the magnetoresistance ratio was 125% or more. When the seed layer was formed to have a thickness of 6 nm using Pt, the magnetoresistance ratio was about 100%.

Figure 11:
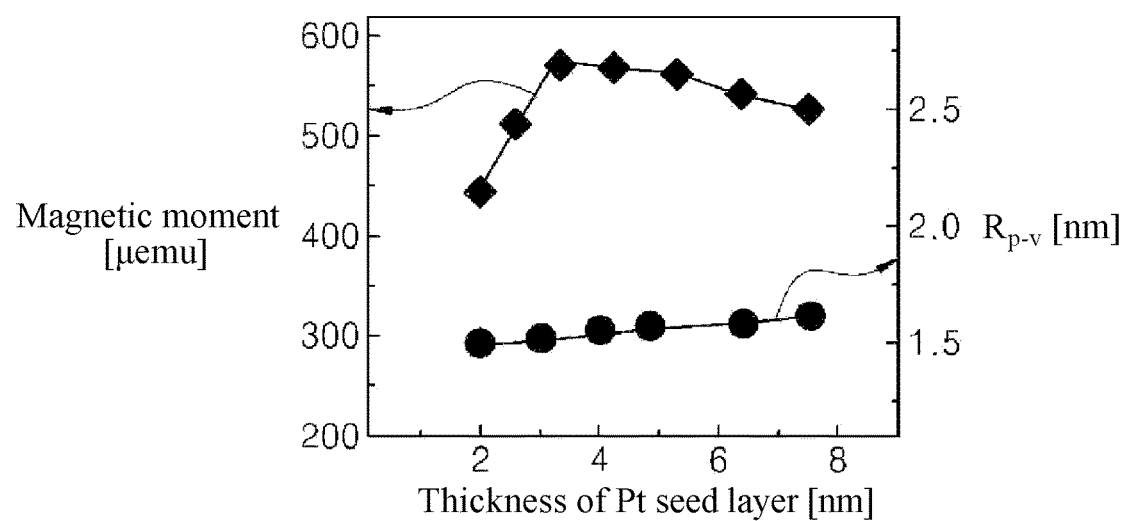
FIG. 11 is a graph showing the surface roughness of a seed layer and the perpendicular magnetization values of SyAF layers depending on the thicknesses of the seed layer according to an embodiment of the present invention.

FIG. 11 is a graph showing the surface roughness of a seed layer and the perpendicular magnetization values of SyAF layers depending on the thicknesses of the seed layer according to an embodiment of the present invention in which Pt is used as the seed layer. When the thickness of the Pt seed layer is 2 nm, the perpendicular magnetization value of the SyAF layers is 44 μemu. In this case, since perfect FCC (111) growth of the SyAF layers of $[Co/Pt]_n$ is not achieved, the magnetization value is small. However, the thickness of the Pt seed layer increases to 3 nm, the perpendicular magnetization value increases to 570 μemu. This result indicates that FCC (111) growth of the SyAF layers is promoted. In addition, when the thickness of the Pt seed layer increases to 5 nm or more, the perpendicular magnetization value decreases. These results indicate that unlike FCC (111) growth of the SyAF layers, as the Pt seed layer becomes thicker, the surface roughness increases and perpendicular magnetization properties between the layers become deteriorated.

Hereinafter, a memory device according to another embodiment of the present invention will be described with reference to FIGS. 12 to 18.

Figure 12:
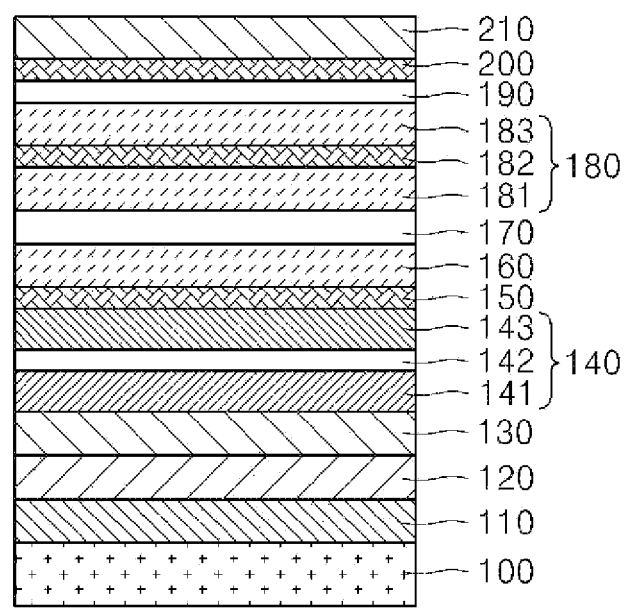
FIG. 12 is a cross-sectional view of a memory device according to one embodiment of the present invention.

FIG. 12 is a cross-sectional view of a memory device according to one embodiment of the present invention, that is, a cross-sectional view of an STT-MRAM device.

Referring to FIG. 12, a memory device according to one embodiment of the present invention includes a lower electrode 110, a first buffer layer 120, a seed layer 130, SyAF layers 140, a separation layer 150, a pinned layer 160, a tunnel barrier 170, free layers 180, a second buffer layer 190, a capping layer 200, and an upper electrode 210, which are formed on a substrate 100. In this case, the SyAF layers 140 are formed by laminating a first magnetic layer 141, a non-magnetic layer 142, and a second magnetic layer 143, and the pinned layer 160, the tunnel barrier 170, and the free layers 180 form a magnetic tunnel junction. That is, in the memory device according to the present invention, the SyAF layers 140 are first formed on the substrate 100, and then the magnetic tunnel junction is formed thereon.

The substrate 100 may be a semiconductor substrate. For example, as the substrate 100, a silicon substrate, a gallium arsenide substrate, a silicon germanium substrate, a silicon oxide film substrate, or the like may be used. In this embodiment, a silicon substrate is used. In addition, a selection element including a transistor may be formed on the substrate 100. In addition, an insulating layer (not shown) may be formed on the substrate 100. That is, the insulating layer may be formed to cover predetermined structures such as a selection element, and may be provided with a contact hole exposing at least a part of the selection element. The insulating layer may be formed using a silicon oxide ($SiO_2$) film having an amorphous structure.

The lower electrode 110 is formed on the substrate 100. The lower electrode 110 may be formed using conductive materials, such as metals and metal nitrides. In addition, the lower electrode 110 of the present invention may be formed as at least one layer. That is, the lower electrode 110 may be formed as a single layer or as two or more layers. When the lower electrode 110 is formed as a single layer, the lower electrode 110 may be formed of a metal nitride, such as a titanium nitride (TiN) film. In addition, the lower electrode 110 may be formed as a dual structure in which first and second lower electrodes are formed. In this case, the first lower electrode may be formed on the substrate 100, and the second lower electrode may be formed on the first lower electrode. In addition, when an insulating layer is formed on the substrate 100, the first lower electrode may be formed on the insulating layer or within the insulating layer. In this case, the first lower electrode may be connected to the selection element formed on the substrate 100. The lower electrode 110 may be formed of a polycrystalline conductive material. That is, the first and second lower electrodes may each be formed of a conductive material having a BCC structure. For example, the first lower electrode may be formed of a metal such as tungsten (W), and the second lower electrode may be formed of a metal nitride such as a titanium nitride (TiN) film.

The first buffer layer 120 is formed on the upper part of the lower electrode 110. The first buffer layer 120 may be formed of a material having excellent compatibility with the lower electrode 110 to eliminate lattice constant mismatch between the lower electrode 110 and the seed layer 130. For example, when the lower electrode 110 or the second lower electrode is formed of TiN, the first buffer layer 120 may be formed using tantalum (Ta) having excellent lattice compatibility with TiN. In this case, Ta is amorphous, but the lower electrode 110 is polycrystalline. Therefore, the amorphous first buffer layer 120 may grow in the crystal direction of the polycrystalline lower electrode 110, and then crystallinity may be improved by heat treatment. In addition, the first buffer layer 120 may be formed to have a thickness of, for example, 2 nm to 10 nm.

The seed layer 130 is formed on the first buffer layer 120. The seed layer 130 may be formed of a material allowing crystal growth of the SyAF layers 140. That is, the seed layer 130 allows the first and second magnetic layers 141 and 143 of the SyAF layers 140 to grow in a desired crystal direction. For example, the seed layer 130 may be formed of a metal that facilitates crystal growth in the (111) direction of a face-centered cubic (FCC) lattice or the (001) direction of a hexagonal close-packed (HCP) structure. The seed layer 130 may include tantalum (Ta), ruthenium (Ru), titanium (Ti), palladium (Pd), platinum (Pt), magnesium (Mg), cobalt (Co), aluminum (Al), tungsten (W), and alloys thereof. Preferably, the seed layer 130 is formed of platinum (Pt) to have a thickness of 1 nm to 3 nm.

The SyAF layers 140 are formed on the seed layer 130. The SyAF layers 140 serve to fix the magnetization of the pinned layer 160. The SyAF layers 140 include the first magnetic layer 141, the non-magnetic layer 142, and the second magnetic layer 143. That is, in the SyAF layers 140, the first magnetic layer 141 and the second magnetic layer 143 are antiferromagnetically coupled via the non-magnetic layer 142. In this case, the first magnetic layer 141 and the second magnetic layer 143 may have crystals oriented in the FCC (111) direction or the HCP (001) direction. In addition, the magnetization directions of the first and second magnetic layers 141 and 143 are arranged antiparallel. For example, the first magnetic layer 141 may be magnetized in the upward direction (that is, the direction toward an upper electrode 200), and the second magnetic layer 143 may be magnetized in the downward direction (that is, the direction toward the substrate 100). Conversely, the first magnetic layer 141 may be magnetized in the downward direction, and the second magnetic layer 143 may be magnetized in the upward direction. The first magnetic layer 141 and the second magnetic layer 143 may be formed by alternately laminating a magnetic metal and a non-magnetic metal. A single metal selected from the group consisting of iron (Fe), cobalt (Co), and nickel (Ni) or an alloy thereof may be used as the magnetic metal, and a single metal selected from the group consisting of chromium (Cr), platinum (Pt), palladium (Pd), iridium (Jr), rhodium (Rh), ruthenium (Ru), osmium (Os), rhenium (Re), gold (Au), and copper (Cu) or an alloy thereof may be used as the non-magnetic metal. For example, the first magnetic layer 141 and the second magnetic layer 143 may be formed of $[Co/Pd]_n$, $[Co/Pt]_n$, or $[CoFe/Pt]_n$ (wherein n is an integer of 1 or more). In this case, the first magnetic layer 141 may be formed thicker than the second magnetic layer 143. In addition, the first magnetic layer 141 may be formed as a plurality of layers, and the second magnetic layer 143 may be formed as a single layer. That is, the first magnetic layer 141 may be formed to have a structure in which the magnetic metal and the non-magnetic metal are repeatedly laminated a plurality of times, and the second magnetic layer 143 may be formed to have a structure in which the magnetic metal and the non-magnetic metal are laminated once, that is, a single laminated structure. For example, the first and second magnetic layers 141 and 143 may be formed to have the same thickness by laminating the same material a plurality of times. In this case, the number of times of lamination may be larger at the time of forming the first magnetic layer 141 as compared to at the time of forming the second magnetic layer 143. For example, the first magnetic layer 141 may be formed of $[Co/Pt]_6$, that is, may be formed by laminating Co and Pt six times, and the second magnetic layer 143 may be formed of $[Co/Pt]_3$, that is, may be formed by laminating Co and Pt three times. In this case, Co may be laminated to a thickness of 0.3 nm to 0.5 nm. Pt may be laminated thinner than Co, or be laminated to the same thickness as Co. For example, Pt may be laminated to a thickness of 0.2 nm to 0.4 nm. The non-magnetic layer 142 is formed between the first magnetic layer 141 and the second magnetic layer 143 and is formed of a nonmagnetic material that allows the first magnetic layer 141 and the second magnetic layer 143 to form diamagnetic coupling with each other. For example, the non-magnetic layer 142 may be formed of a single metal selected from the group consisting of ruthenium (Ru), rhodium (Rh), osmium (Os), rhenium (Re), and chromium (Cr) or an alloy thereof, preferably ruthenium (Ru). In addition, when the second magnetic layer 143 is formed as a single laminated structure, that is, a single layer, the thickness of the first magnetic layer 141 may also be reduced, thereby reducing the total thickness of the memory device. That is, the magnetization value of the first magnetic layer 141 and the sum of the magnetization values of the second magnetic layer 143 and the pinned layer 160 should be the same with respect to the non-magnetic layer 142. However, when the second magnetic layer 143 is formed by laminating a plurality of times, to make the sum of the magnetization values of the second magnetic layer 143 and the pinned layer 160 equal to the magnetization value of the first magnetic layer 141, the number of times of lamination should be increased at the time of forming the first magnetic layer 141 as compared to at the time of forming the second magnetic layer 143. However, according to the present invention, since the second magnetic layer 143 is formed as a single structure, the number of times of lamination at the time of forming the first magnetic layer 141 may be reduced as compared with conventional cases. As a result, the total thickness of the memory device may be reduced.

The separation layer 150 is formed on the upper part of the SyAF layers 140. The separation layer 150 is formed so that the magnetizations of the SyAF layers 140 and the pinned layer 160 are generated independently of each other. In addition, the separation layer 150 is formed of a material capable of improving the crystallinity of a magnetic tunnel junction including the pinned layer 160, the tunnel barrier 170, and the free layers 180. For example, the separation layer 150 may be formed of a polycrystalline material, that is, a conductive material having a BCC structure, such as tungsten (W). When the separation layer 150 is formed of a polycrystalline material, the crystallinity of the magnetic tunnel junction including the pinned layer 160, the tunnel barrier 170, and the free layers 180, which are formed on the upper part of the separation layer 150, may be improved. That is, when the polycrystalline separation layer 150 is formed, the amorphous magnetic tunnel junction formed on the upper part thereof may grow in the crystal direction of the separation layer, and the crystallinity of the magnetic tunnel junction may be improved by heat treatment for perpendicular magnetic anisotropy as compared with conventional cases. In particular, when the separation layer 150 is formed of W, the separation layer 150 is crystallized after heat treatment at a high temperature of 400° C. or more, for example, 400° C. to 500° C., thereby preventing a heterogeneous material from diffusing into the tunnel barrier 170. In addition, the pinned layer 160 and the free layers 180 may be crystallized, thereby maintaining the perpendicular magnetic anisotropy of the magnetic tunnel junction. That is, when the crystallinity of the magnetic tunnel junction is improved, the magnitude of magnetization generated when a magnetic field is applied is increased, and the amount of current flowing through the magnetic tunnel junction in a parallel state is increased. Therefore, application of the magnetic tunnel junction to a memory device may improve the operating speed and reliability of the memory device. In addition, the separation layer 150 may be formed to have a thickness of 0.2 nm to 0.5 nm. In this case, the second magnetic layer 143 of the SyAF layers 140 and the pinned layer 160 must be ferro-coupled to fix the magnetization direction of the pinned layer 160. However, when W is used to form the separation layer 150 having a thickness of more than 0.5 nm, the magnetization direction of the pinned layer 160 is not fixed and has the same magnetization direction as the free layers 180 due to increase in the thickness of the separation layer 150. As a result, the same magnetization direction and other magnetization directions required in an MRAM device do not occur, and thus the MRAM device does not operate as a memory.

The pinned layer 160 is formed on the separation layer 150 and is formed of a ferromagnetic material. In the pinned layer 160, magnetization may be fixed to one direction in a magnetic field within a predetermined range. For example, the magnetization direction may be fixed to a direction extending from the upper part to the lower part. For example, the pinned layer 160 may be formed using a full-Heusler half-metal alloy, an amorphous rare-earth element alloy, a multilayer thin film in which a magnetic metal (ferromagnetic metal) and a non-magnetic metal are alternately laminated, an alloy having an L10 type crystal structure, or a ferromagnetic material such as a cobalt alloy. As the full-Heusler half-metal alloy, CoFeAl and CoFeAlSi may be used. As the amorphous rare-earth element alloy, alloys such as TbFe, TbCo, TbFeCo, DyTbFeCo, and GdTbCo may be used. In addition, the multilayer thin film in which a magnetic metal and a non-magnetic metal are alternately laminated includes Co/Pt, Co/Pd, CoCr/Pt, Co/Ru, Co/Os, Co/Au, Ni/Cu, CoFeAl/Pd, CoFeAl/Pt, CoFeB/Pd, CoFeB/Pt, and the like. In addition, the alloy having an L10 type crystal structure includes Fe50Pt50, Fe50Pd50, Co50Pt50, Fe30Ni20Pt50, Co30Ni20Pt50, and the like. In addition, the cobalt alloy includes CoCr, CoPt, CoCrPt, CoCrTa, CoCrPtTa, CoCrNb, CoFeB, and the like. Among these materials, the CoFeB single layer may be formed thicker than CoFeB and Co/Pt or Co/Pd of a multilayer structure, and thus the magnetoresistance ratio may be increased. In addition, since CoFeB is easier to etch than metals such as Pt and Pd, the CoFeB single layer is easier to fabricate than a multilayer structure containing Pt or Pd. In addition, CoFeB may have a perpendicular magnetization or a horizontal magnetization by adjusting the thickness thereof. Therefore, according to an embodiment of the present invention, a CoFeB single layer is used to form the pinned layer 160. The CoFeB is formed in an amorphous state, and then heat treatment is performed for texturing in the BCC (100) direction.

The tunnel barrier 170 is formed on the pinned layer 160 and separates the pinned layer 160 and the free layers 180. The tunnel barrier 170 allows quantum-mechanical tunneling between the pinned layer 160 and the free layers 180. The tunnel barrier 170 may be formed of magnesium oxide (MgO), aluminum oxide ($Al_2O_3$), silicon oxide ($SiO_2$), tantalum oxide ($Ta_2O_5$), silicon nitride (SiNx), aluminum nitride (AlNx), or the like. In an embodiment of the present invention, polycrystalline magnesium oxide is used as the tunnel barrier 170. After the tunnel barrier 170 is formed of the magnesium oxide, heat treatment is performed for texturing in the BCC (100) direction.

The free layers 180 are formed on the tunnel barrier 170. In the free layers 180, the direction of magnetization is not fixed to one direction, but may be switched from one direction to the opposite direction. That is, the magnetization direction of the free layers 180 may be the same (that is, parallel) as or opposite (that is, antiparallel) to the magnetization direction of the pinned layer 160. A magnetic tunnel junction may be utilized as a memory element by mapping information of '0' or '1' to a resistance value which changes depending on the magnetization arrangement of the free layers 180 and the pinned layer 160. For example, when the magnetization direction of the free layers 180 is parallel to that of the pinned layer 160, the resistance value of a magnetic tunnel junction becomes small. In this case, data may be defined as '0'. In addition, when the magnetization direction of the free layers 180 is antiparallel to that of the pinned layer 160, the resistance value of a magnetic tunnel junction becomes large. In this case, data may be defined as '1'. For example, the free layers 180 may be formed of a full-Heusler half-metal alloy, an amorphous rare-earth element alloy, a multilayer thin film in which a magnetic metal and a non-magnetic metal are alternately laminated, or a ferromagnetic material such as an alloy having an L10 type crystal structure. In addition, the free layers 180 may be formed to have a laminated structure in which a first free layer 181, an insertion layer 182, and a second free layer 183 are laminated. That is, the free layers 180 may have a structure in which the first and second free layers 181 and 183 are separated from each other in the vertical direction by the insertion layer 182. In this case, the magnetization directions of the first and second free layers 181 and 183 may be the same or different. For example, both the first and second free layers 181 and 183 may have perpendicular magnetization, or the first free layer 181 may have perpendicular magnetization and the second free layer 183 may have horizontal magnetization. In addition, the insertion layer 182 may be formed of a material having a BCC structure without magnetization. That is, the first free layer 181 may be perpendicularly magnetized, the insertion layer 182 may not be magnetized, and the second free layer 183 may be perpendicularly or horizontally magnetized. In this case, each of the first and second free layers 181 and 183 may be formed of CoFeB, and the first free layer 181 may be formed thinner than the second free layer 183 or may be formed to have the same thickness as the second free layer 183. In addition, the insertion layer 182 may be formed thinner than the first or second free layer 181 or 183. For example, each of the first and second free layers 181 and 183 may be formed to have a thickness of 0.5 nm to 1.5 nm using CoFeB, and the insertion layer 182 may be formed to have a thickness of 0.2 nm to 0.5 nm using a material having a BCC structure, e.g., W.

The second buffer layer 190 is formed on the free layers 180. The second buffer layer 190 may be formed of magnesium oxide (MgO), aluminum oxide ($Al_2O_3$), silicon oxide ($SiO_2$), tantalum oxide ($Ta_2O_5$), or the like. That is, the second buffer layer 190 may be formed of an oxide. In an embodiment of the present invention, the second buffer layer 190 is formed using polycrystalline magnesium oxide. The second buffer layer 190 is formed so that the free layers 180 have perpendicular magnetic properties. That is, oxygen present in the second buffer layer 190 diffuses into the free layers 180 and bonds with a material in the free layers 180, which causes the free layers 180 to have perpendicular magnetic properties. In addition, the second buffer layer 190 may be formed to have a thickness of, for example, 0.8 nm to 1.2 nm.

The capping layer 200 is formed on the second buffer layer 190. The capping layer 200 is formed of a polycrystalline material, for example, a conductive material having a BCC structure. For example, the capping layer 200 may be formed of tungsten (W). When the capping layer 200 is formed of a polycrystalline material, the crystallinity of the magnetic tunnel junction formed under the capping layer 200 may be improved. That is, when an amorphous magnetic tunnel junction is formed on the separation layer 150 having a BCC structure, the amorphous magnetic tunnel junction grows in the crystal direction of the separation layer 150, and the capping layer 200 having a BCC structure is formed on the magnetic tunnel junction. When heat treatment is subsequently performed, the crystallinity of the magnetic tunnel junction may be further improved. In addition, the capping layer 200 serves to prevent diffusion of the upper electrode 210. The capping layer 200 may be formed to have a thickness of, for example, 1 nm to 6 nm.

The upper electrode 210 is formed on the capping layer 200. The upper electrode 210 may be formed of a conductive material such as a metal, a metal oxide, and a metal nitride. For example, the upper electrode 210 may be formed of a single metal selected from the group consisting of tantalum (Ta), ruthenium (Ru), titanium (Ti), palladium (Pd), platinum (Pt), magnesium (Mg), and aluminum (Al) or an alloy thereof.

As described above, in the memory device according to the embodiments of the present invention, the lower electrode 110 is formed of a polycrystalline material, the SyAF layers 140 are formed on the upper part thereof, and then a magnetic tunnel junction is formed. Therefore, since the FCC (111) structure of the SyAF layers 140 does not diffuse into the magnetic tunnel junction, the BCC (100) crystal structure of the magnetic tunnel junction may be preserved, and the magnetization direction of the magnetic tunnel junction may be rapidly changed, thereby increasing the operating speed of a memory. In addition, according to the present invention, at least one, preferably all, of the separation layer 150, the insertion layer 182, and the capping layer 200 is formed using a material having a BCC structure, such as tungsten, so that the perpendicular magnetic anisotropy of the magnetic tunnel junction may be maintained at a temperature of about 400° C. That is, after the upper electrode 210 is formed, a passivation process and a metal wiring process are performed at a temperature of about 400° C. At this time, in the conventional case in which the separation layer or the capping layer is formed using tantalum (Ta), tantalum diffuses at about 400° C., thus deteriorating the perpendicular magnetic anisotropy of the magnetic tunnel junction. However, in the present invention, since tungsten is used, diffusion is prevented, and thus the perpendicular magnetic anisotropy of the magnetic tunnel junction may be maintained.

Figure 13:
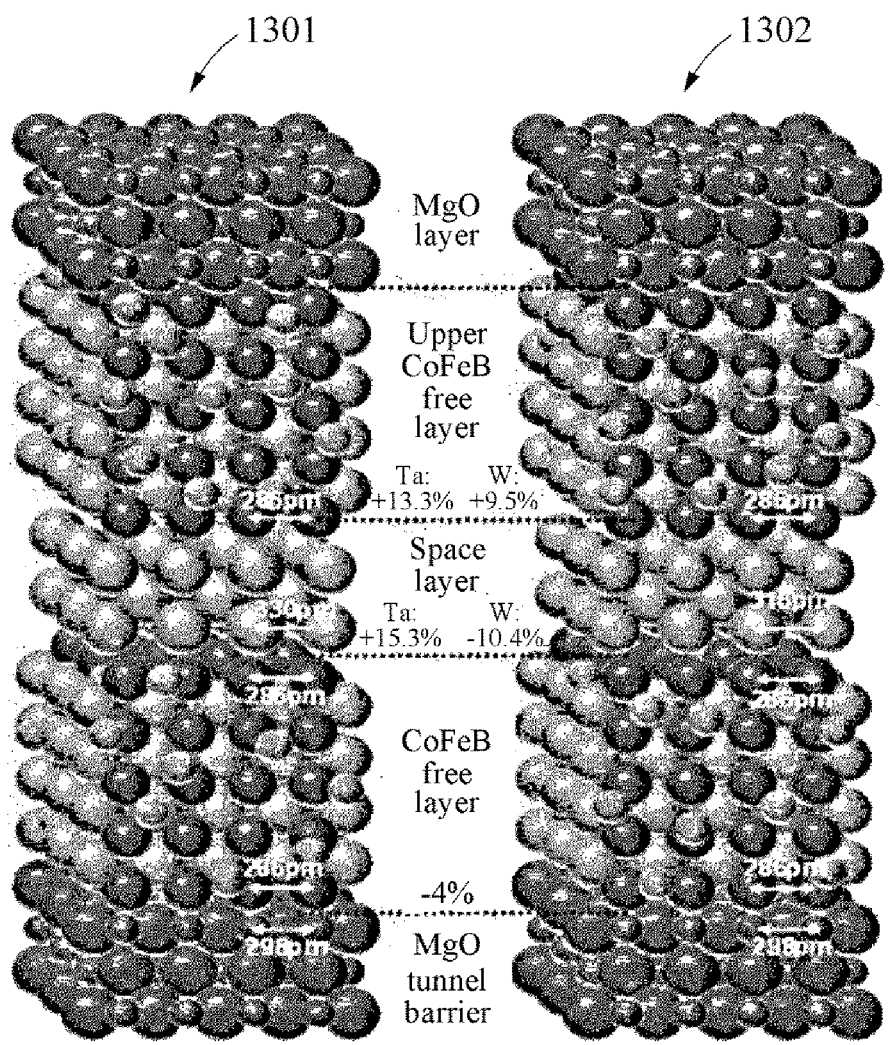
FIG. 13 includes schematic diagrams showing the lattice constant of a magnetic tunnel junction having double free layers according to a comparative example and a magnetic tunnel junction having double free layers according to an embodiment of the present invention.

FIG. 13 includes schematic diagrams showing the lattice constant of a magnetic tunnel junction having double free layers according to a comparative example and a magnetic tunnel junction having double free layers according to an embodiment of the present invention. Specifically, in the comparative example (1301), a magnetic tunnel junction was formed by laminating a MgO tunnel barrier, a CoFeB first free layer, an insertion layer, a CoFeB second free layer, and a MgO buffer layer, and Ta was used as the insertion layer. On the other hand, in the embodiment of the present invention (1302), a magnetic tunnel junction was formed in the same manner as in the comparative example except that W was used as the insertion layer. The lattice constants of the magnetic tunnel junctions are shown in FIG. 13. In the case of the comparative example in which the insertion layer formed between the first and second free layers is formed using Ta, the lattice constant of Ta is 330 pm, and the lattice constant of the two CoFeB free layers is 286 pm. Thus, a lattice structure mismatching rate between the Ta insertion layer and the first and second CoFeB free layers is −15.3% and 13.3%. However, in the case of the embodiment of the present invention in which the insertion layer formed between the first and second free layers is formed using W, the lattice constant of W is 316 pm, and a lattice structure mismatching rate between the W insertion layer and the first and second CoFeB free layers is −10.4% and 9.5%. That is, W has a lower lattice structure mismatching rate with CoFeB than Ta. As the mismatching rate of the lattice structure decreases, occurrence of diffusion decreases. Thus, in the embodiment of the present invention in which W is used as the insertion layer, diffusion of the material of the insertion layer into the free layers is suppressed as compared with the comparative example in which Ta is used as the insertion layer. Therefore, materials having a lower lattice constant than Ta may be used to form the separation layer, the insertion layer, and the capping layer. For example, 3d transition metals including vanadium (302 pm), chromium (288 pm), and molybdenum (315 pm), which are BCC materials having a smaller lattice constant than Ta, may be used in place of W. That is, a material having a BCC structure, which has a lattice constant of less than 330 pm, for example, 280 pm or more and less than 330 pm, may be used to form the separation layer, the insertion layer, and the capping layer.

Figure 14:
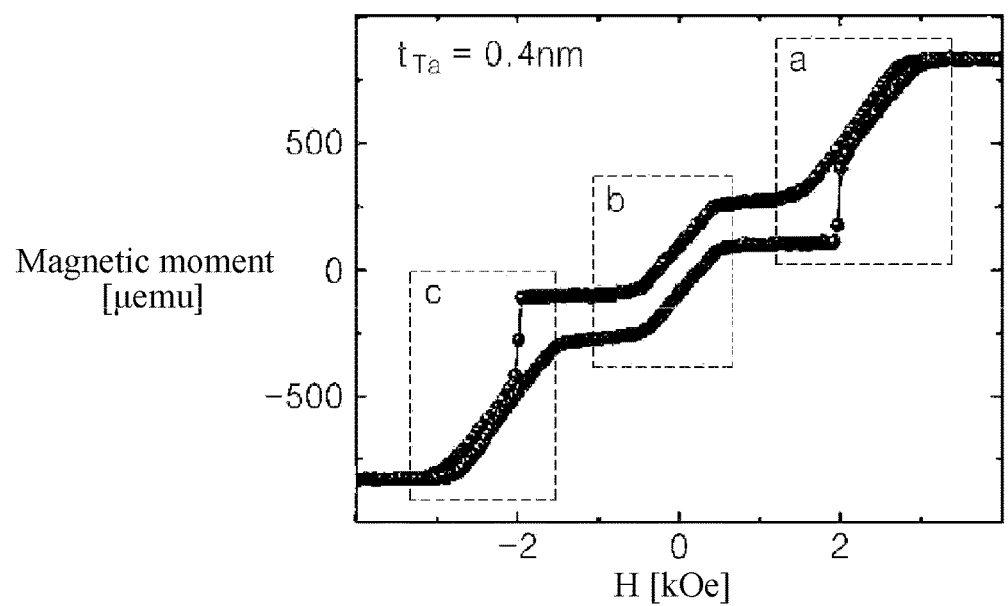
FIGS. 14 and 15 are graphs showing the perpendicular magnetic anisotropy properties of a memory device according to a comparative example and a memory device according to an embodiment of the present invention after heat treatment at 400° C.
Figure 15:
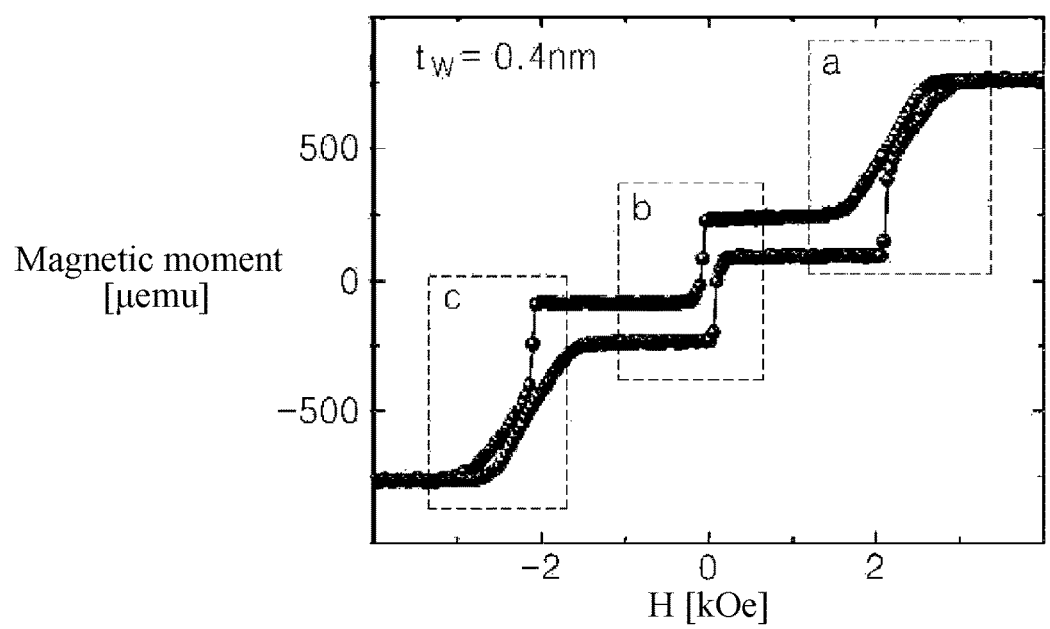

FIGS. 14 and 15 are graphs showing the perpendicular magnetic anisotropy properties of a memory device according to a comparative example and a memory device according to an embodiment of the present invention after heat treatment at 400° C. Specifically, in the case of the comparative example, a lower electrode, SyAF layers, a separation layer, a magnetic tunnel junction, a capping layer, and an upper electrode were laminated on a substrate, and free layers included in the magnetic tunnel junction were formed to have a structure in which an insertion layer was formed between first and second free layers, and the separation layer, the insertion layer, and the capping layer were each formed of Ta. The perpendicular magnetic anisotropy properties according to the comparative example are shown in FIG. 14. In the case of the embodiment of the present invention, a memory device was formed in the same manner as in the comparative example except that the separation layer, the insertion layer, and the capping layer were each formed of W. The perpendicular magnetic anisotropy properties according to the embodiment are shown in FIG. 15. As shown in FIGS. 14 and 15, in the comparative example and the embodiment, the perpendicular magnetic properties of the pinned layer and the SyAF layer are almost the same in the region ('a' region) of 1.5 [kOe] or more and in the region ('c' region) of −1.5 [kOe] or less. However, in the region of −500 [Oe] to 500 [Oe] ('b' region) showing the perpendicular magnetic properties of the double free layers, i.e., the dual information storage layer, for securing the tunnel magnetoresistance ratio, the perpendicular magnetic properties of the comparative example and the embodiment are different. As shown in FIG. 14, in the case of the comparative example using Ta, the perpendicular magnetic properties of the double free layers are deteriorated after heat treatment at 400° C., and thus the double free layers may not function as an information storage. However, as shown in FIG. 15, in the case of the embodiment using W, occurrence of W diffusion is reduced after heat treatment at 400° C. as compared with the comparative example, and as a result, the perpendicular magnetic properties of the double free layers are not deteriorated.

Figure 16:
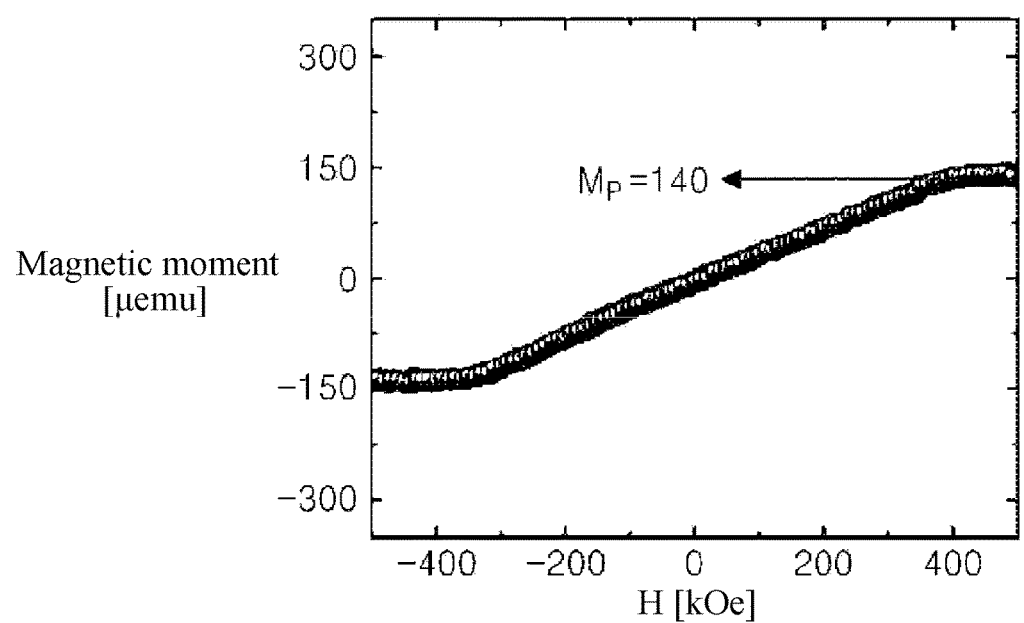
FIGS. 16 and 17 are graphs showing the perpendicular magnetic anisotropy properties of the double free layers of a memory device according to a comparative example and a memory device according to an embodiment of the present invention after heat treatment at 400° C.
Figure 17:
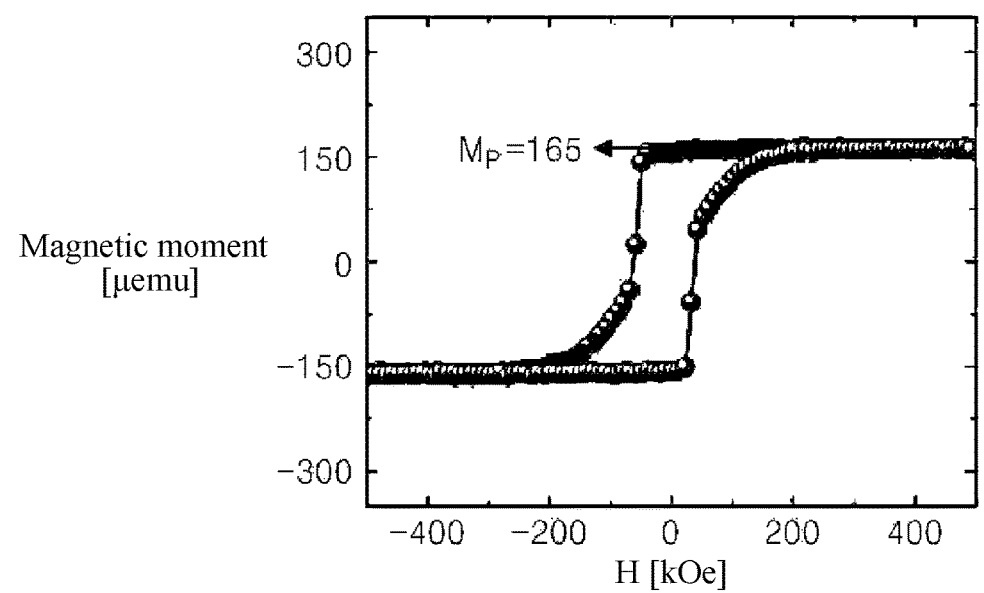

FIGS. 16 and 17 are graphs showing the perpendicular magnetic anisotropy properties of the double free layers ('b' region). Specifically, in the region of −500 [Oe] to 500 [Oe], the perpendicular magnetic properties of the double free layers, that is, the dual information storage layer, are exhibited. As shown in FIG. 16, in the case of the comparative example using Ta, squareness indicating perpendicular properties is not observed, and a perpendicular magnetic moment of 140 μemu is observed. Thus, it can be seen that a low MR ratio is exhibited after heat treatment at 400° C. However, as shown in FIG. 17, in the case of the embodiment using W, almost perfect squareness is observed even after heat treatment at 400° C., and the double free layers exhibit a perpendicular magnetization value of 165 μemu. Thus, a high MR ratio is exhibited. In addition, the magnetization value of a single information storage layer, i.e., a single CoFeB free layer, is generally about 80 to 90 μemu.

Figure 18:
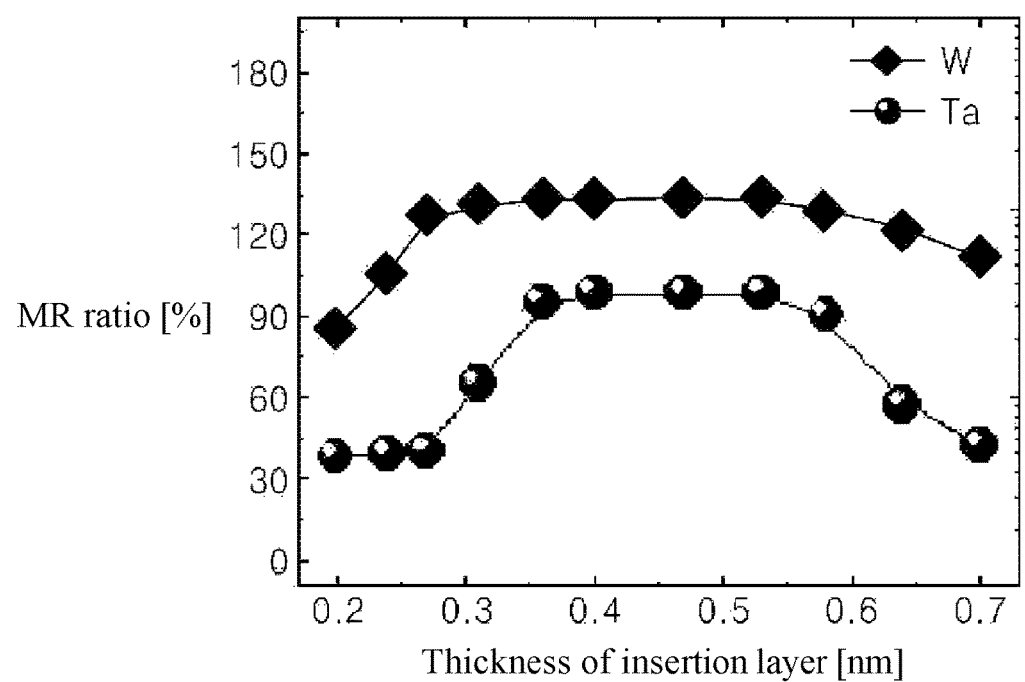
FIG. 18 is a graph showing magnetoresistance (MR) ratios depending on the thicknesses of an insertion layer formed between double free layers according to a comparative example and an embodiment of the present invention.

FIG. 18 is a graph showing magnetoresistance (MR) ratios depending on the thicknesses of an insertion layer formed between double free layers according to a comparative example and an embodiment of the present invention. Specifically, the thicknesses of the Ta insertion layer according to the comparative example and the W insertion layer according to the embodiment were varied from 0.2 nm to 0.7 nm, and the MR ratios were measured after heat treatment at 400° C. In the comparative example, when the thickness of the Ta insertion layer was in a range of 0.4 nm to 0.53 nm, the MR ratio was maintained at 98%. On the other hand, in the case of the embodiment using W, when the thickness of the W insertion layer was in a range of 0.3 nm to 0.53 nm, the MR ratio was maintained at 133%. Therefore, it can be seen that, when W is used as the separation layer, the insertion layer, and the capping layer, the magnetic tunnel junction is not deteriorated even in the subsequent processes performed at 400° C. In addition, in the case of the Ta insertion layer, the usable thickness range is 0.3 nm to 0.4 nm, whereas in the case of the W insertion layer, the usable thickness range is 0.3 nm to 0.5 nm. Therefore, when W is used, a thickness margin of about 2 times may be secured.

Hereinafter, a memory device according to another embodiment of the present invention will be described with reference to FIGS. 19 to 21.

Figure 19:
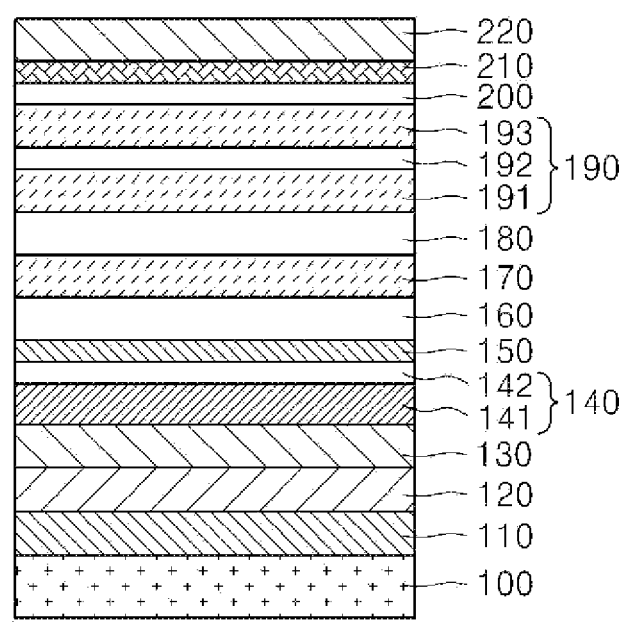
FIG. 19 is a cross-sectional view of a memory device according to one embodiment of the present invention.

FIG. 19 is a cross-sectional view of a memory device according to one embodiment of the present invention, that is, a cross-sectional view of an STT-MRAM device.

Referring to FIG. 19, a memory device according to one embodiment of the present invention includes a lower electrode 110, a first buffer layer 120, a seed layer 130, SyAF layers 140, a second buffer layer 150, a separation layer 160, a pinned layer 170, a tunnel barrier 180, free layers 190, a second buffer layer 200, a capping layer 210, and an upper electrode 220, which are formed on a substrate 100. In this case, the SyAF layers 140 are formed by laminating a magnetic layer 141 and a non-magnetic layer 142, and a pinned layer 160, a tunnel barrier 170, and free layers 180 form a magnetic tunnel junction. That is, in the memory device according to the present invention, the SyAF layers 140 are first formed on the substrate 100, and then the magnetic tunnel junction is formed thereon.

The substrate 100 may be a semiconductor substrate. For example, as the substrate 100, a silicon substrate, a gallium arsenide substrate, a silicon germanium substrate, a silicon oxide film substrate, or the like may be used. In this embodiment, a silicon substrate is used. In addition, a selection element including a transistor may be formed on the substrate 100. In addition, an insulating layer (not shown) may be formed on the substrate 100. That is, the insulating layer may be formed to cover predetermined structures such as a selection element, and may be provided with a contact hole exposing at least a part of the selection element. The insulating layer may be formed using a silicon oxide ($SiO_2$) film having an amorphous structure.

The lower electrode 110 is formed on the substrate 100. The lower electrode 110 may be formed using conductive materials, such as metals and metal nitrides. In addition, the lower electrode 110 of the present invention may be formed as at least one layer. That is, the lower electrode 110 may be formed as a single layer or as two or more layers. When the lower electrode 110 is formed as a single layer, the lower electrode 110 may be formed of a metal nitride, such as a titanium nitride (TiN) film. In addition, the lower electrode 110 may be formed as a dual structure in which first and second lower electrodes are formed. In this case, the first lower electrode may be formed on the substrate 100, and the second lower electrode may be formed on the first lower electrode. In addition, when an insulating layer is formed on the substrate 100, the first lower electrode may be formed on the insulating layer or within the insulating layer. In this case, the first lower electrode may be connected to the selection element formed on the substrate 100. The lower electrode 110 may be formed of a polycrystalline conductive material. That is, the first and second lower electrodes may each be formed of a conductive material having a BCC structure. For example, the first lower electrode may be formed of a metal such as tungsten (W), and the second lower electrode may be formed of a metal nitride such as a titanium nitride (TiN) film.

The first buffer layer 120 is formed on the upper part of the lower electrode 110. The first buffer layer 120 may be formed of a material having excellent compatibility with the lower electrode 110 to eliminate lattice constant mismatch between the lower electrode 110 and the seed layer 130. For example, when the lower electrode 110 or the second lower electrode is formed of TiN, the first buffer layer 120 may be formed using tantalum (Ta) having excellent lattice compatibility with TiN. In this case, Ta is amorphous, but the lower electrode 110 is polycrystalline. Therefore, the amorphous first buffer layer 120 may grow in the crystal direction of the polycrystalline lower electrode 110, and then crystallinity may be improved by heat treatment. In addition, the first buffer layer 120 may be formed to have a thickness of, for example, 2 nm to 10 nm.

The seed layer 130 is formed on the first buffer layer 120. The seed layer 130 may be formed of a material allowing crystal growth of the SyAF layers 140. That is, the seed layer 130 allows the first and second magnetic layers 141 and 143 of the SyAF layers 140 to grow in a desired crystal direction. For example, the seed layer 130 may be formed of a metal that facilitates crystal growth in the (111) direction of a face-centered cubic (FCC) lattice or the (001) direction of a hexagonal close-packed (HCP) structure. The seed layer 130 may include tantalum (Ta), ruthenium (Ru), titanium (Ti), palladium (Pd), platinum (Pt), magnesium (Mg), cobalt (Co), aluminum (Al), tungsten (W), and alloys thereof. Preferably, the seed layer 130 is formed of platinum (Pt) to have a thickness of 1 nm to 3 nm.

The SyAF layers 140 are formed on the seed layer 130. The SyAF layers 140 serve to fix the magnetization of the pinned layer 160. The SyAF layers 140 include the magnetic layer 141 and the non-magnetic layer 142. That is, the SyAF layers of the present invention include one magnetic layer and one non-magnetic layer. In this case, the magnetic layer 141 may have crystals oriented in the FCC (111) direction or the HCP (001) direction. In addition, the magnetic layer 141 may be magnetized in the upward direction (that is, the direction toward the upper electrode 220) or the downward direction (that is, the direction toward the substrate 100). The magnetic layer 141 may be formed by alternately laminating a magnetic metal and a non-magnetic metal. A single metal selected from the group consisting of iron (Fe), cobalt (Co), and nickel (Ni) or an alloy thereof may be used as the magnetic metal, and a single metal selected from the group consisting of chromium (Cr), platinum (Pt), palladium (Pd), iridium (Jr), rhodium (Rh), ruthenium (Ru), osmium (Os), rhenium (Re), gold (Au), and copper (Cu) or an alloy thereof may be used as the non-magnetic metal. For example, the magnetic layer 141 may be formed of $[Co/Pd]_n$, $[Co/Pt]_n$, or $[CoFe/Pt]_n$ (wherein n is an integer of 1 or more). That is, the magnetic layer 141 may be formed to have a structure in which the magnetic metal and the non-magnetic metal are repeatedly laminated a plurality of times. For example, the first magnetic layer 141 may be formed of $[Co/Pt]_3$, that is, may be formed by laminating Co and Pt three times. In this case, Co may be laminated to a thickness of 0.3 nm to 0.5 nm. Pt may be laminated thinner than Co, or be laminated to the same thickness as Co. For example, Pt may be laminated to a thickness of 0.2 nm to 0.4 nm. The non-magnetic layer 142 may be formed of a nonmagnetic material. For example, the non-magnetic layer 142 may be formed of a single metal selected from the group consisting of ruthenium (Ru), rhodium (Rh), osmium (Os), rhenium (Re), and chromium (Cr) or an alloy thereof, preferably ruthenium (Ru). For example, the non-magnetic layer 142 may be formed to have a structure of Co/Ru/Co. When the magnetic layer 141 is formed as one layer, the thickness of the SyAF layers 140 may be reduced, thereby reducing the total thickness of the memory device.

The second buffer layer 150 is formed on the SyAF layers 140. That is, the second buffer layer 150 is formed on the non-magnetic layer 142. The second buffer layer 150 may be formed as a magnetic layer having a single-layer structure. In addition, the second buffer layer 150 may have crystals oriented in the FCC (111) direction or the HCP (001) direction. Therefore, the second buffer layer 150 and the magnetic layer 141 of the SyAF layers 140 are antiferromagnetically coupled via the non-magnetic layer 142. In addition, the magnetization directions of the magnetic layer 141 and the second buffer layer 150 are arranged antiparallel. For example, the magnetic layer 141 may be magnetized in the upward direction (that is, the direction toward the upper electrode 220), and the second buffer layer 150 may be magnetized in the downward direction (that is, the direction toward the substrate 100). Conversely, the magnetic layer 141 may be magnetized in the downward direction, and the second buffer layer 150 may be magnetized in the upward direction. The second buffer layer 150 may be formed as a structure in which the magnetic metal and the non-magnetic metal are laminated once. A single metal selected from the group consisting of iron (Fe), cobalt (Co), and nickel (Ni) or an alloy thereof may be used as the magnetic metal, and a single metal selected from the group consisting of chromium (Cr), platinum (Pt), palladium (Pd), iridium (Jr), rhodium (Rh), ruthenium (Ru), osmium (Os), rhenium (Re), gold (Au), and copper (Cu) or an alloy thereof may be used as the non-magnetic metal. For example, the second buffer layer 150 may be formed of Co/Pd, Co/Pt, or CoFe/Pt. That is, the second buffer layer 150 may be formed to have a structure in which the magnetic metal and the non-magnetic metal are laminated once, that is, a single laminated structure. In this case, Co may be laminated to a thickness of 0.3 nm to 0.5 nm. Pt may be laminated thinner than Co, or be laminated to the same thickness as Co. For example, Pt may be laminated to a thickness of 0.2 nm to 0.4 nm. In this case, the magnetization value of the magnetic layer 141 and the sum of the magnetization values of the second buffer layer 150 and the pinned layer 170 should be the same with respect to the non-magnetic layer 142.

The separation layer 160 is formed on the upper part of the second buffer layer 150. The separation layer 160 is formed so that the magnetizations of the SyAF layers 140 and the pinned layer 170 are generated independently of each other. In addition, the separation layer 160 is formed of a material capable of improving the crystallinity of a magnetic tunnel junction including the pinned layer 170, the tunnel barrier 180, and the free layers 190. For example, the separation layer 160 may be formed of a polycrystalline material, that is, a conductive material having a BCC structure, such as tungsten (W). When the separation layer 160 is formed of a polycrystalline material, the crystallinity of the magnetic tunnel junction including the pinned layer 170, the tunnel barrier 180, and the free layers 190, which are formed on the upper part of the separation layer 160, may be improved. That is, when the polycrystalline separation layer 160 is formed, the amorphous magnetic tunnel junction formed on the upper part thereof may grow in the crystal direction of the separation layer 160, and the crystallinity of the magnetic tunnel junction may be improved by heat treatment for perpendicular magnetic anisotropy as compared with conventional cases. In particular, when the separation layer 160 is formed of W, the separation layer 160 is crystallized after heat treatment at a high temperature of 400° C. or more, for example, 400° C. to 500° C., thereby preventing a heterogeneous material from diffusing into the tunnel barrier 180. In addition, the pinned layer 170 and the free layers 190 may be crystallized, thereby maintaining the perpendicular magnetic anisotropy of the magnetic tunnel junction. That is, when the crystallinity of the magnetic tunnel junction is improved, the magnitude of magnetization generated when a magnetic field is applied is increased, and the amount of current flowing through the magnetic tunnel junction in a parallel state is increased. Therefore, application of the magnetic tunnel junction to a memory device may improve the operating speed and reliability of the memory device. In addition, the separation layer 160 may be formed to have a thickness of 0.2 nm to 0.5 nm. In this case, the SyAF layers 140 and the pinned layer 170 must be ferrocoupled to fix the magnetization direction of the pinned layer 170. However, when W is used to form the separation layer 160 having a thickness of more than 0.5 nm, the magnetization direction of the pinned layer 170 is not fixed and has the same magnetization direction as the free layers 190 due to increase in the thickness of the separation layer 160. As a result, the same magnetization direction and other magnetization directions required in an MRAM device do not occur, and thus the MRAM device does not operate as a memory.

The pinned layer 170 is formed on the separation layer 160 and is formed of a ferromagnetic material. In the pinned layer 170, magnetization may be fixed to one direction in a magnetic field within a predetermined range. For example, the magnetization direction may be fixed to a direction extending from the upper part to the lower part. For example, the pinned layer 170 may be formed using a full-Heusler half-metal alloy, an amorphous rare-earth element alloy, a multilayer thin film in which a magnetic metal (ferromagnetic metal) and a non-magnetic metal are alternately laminated, an alloy having an L10 type crystal structure, or a ferromagnetic material such as a cobalt alloy. As the full-Heusler half-metal alloy, CoFeAl and CoFeAlSi may be used. As the amorphous rare-earth element alloy, alloys such as TbFe, TbCo, TbFeCo, DyTbFeCo, and GdTbCo may be used. In addition, the multilayer thin film in which a magnetic metal and a non-magnetic metal are alternately laminated includes Co/Pt, Co/Pd, CoCr/Pt, Co/Ru, Co/Os, Co/Au, Ni/Cu, CoFeAl/Pd, CoFeAl/Pt, CoFeB/Pd, CoFeB/Pt, and the like. In addition, the alloy having an L10 type crystal structure includes Fe50Pt50, Fe50Pd50, Co50Pt50, Fe30Ni20Pt50, Co30Ni20Pt50, and the like. In addition, the cobalt alloy includes CoCr, CoPt, CoCrPt, CoCrTa, CoCrPtTa, CoCrNb, CoFeB, and the like.

Among these materials, the CoFeB single layer may be formed thicker than CoFeB and Co/Pt or Co/Pd of a multilayer structure, and thus the magnetoresistance ratio may be increased. In addition, since CoFeB is easier to etch than metals such as Pt and Pd, the CoFeB single layer is easier to fabricate than a multilayer structure containing Pt or Pd. In addition, CoFeB may have a perpendicular magnetization or a horizontal magnetization by adjusting the thickness thereof. Therefore, according to an embodiment of the present invention, a CoFeB single layer is used to form the pinned layer 170. The CoFeB is formed in an amorphous state, and then heat treatment is performed for texturing in the BCC (100) direction.

The tunnel barrier 180 is formed on the pinned layer 170 and separates the pinned layer 170 and the free layers 190. The tunnel barrier 180 allows quantum-mechanical tunneling between the pinned layer 170 and the free layers 190. The tunnel barrier 180 may be formed of magnesium oxide (MgO), aluminum oxide ($Al_2O_3$), silicon oxide ($SiO_2$), tantalum oxide ($Ta_2O_5$), silicon nitride (SiNx), aluminum nitride (AlNx), or the like. In an embodiment of the present invention, polycrystalline magnesium oxide is used as the tunnel barrier 180. After the tunnel barrier 180 is formed of the magnesium oxide, heat treatment is performed for texturing in the BCC (100) direction.

The free layers 190 are formed on the tunnel barrier 180. In the free layers 180, the direction of magnetization is not fixed to one direction, but may be switched from one direction to the opposite direction. That is, the magnetization direction of the free layers 190 may be the same (that is, parallel) as or opposite (that is, antiparallel) to the magnetization direction of the pinned layer 170. A magnetic tunnel junction may be utilized as a memory element by mapping information of '0' or '1' to a resistance value which changes depending on the magnetization arrangement of the free layers 190 and the pinned layer 170. For example, when the magnetization direction of the free layers 190 is parallel to that of the pinned layer 170, the resistance value of a magnetic tunnel junction becomes small. In this case, data may be defined as '0'. In addition, when the magnetization direction of the free layers 190 is antiparallel to that of the pinned layer 170, the resistance value of a magnetic tunnel junction becomes large. In this case, data may be defined as '1'. For example, the free layers 190 may be formed of a full-Heusler half-metal alloy, an amorphous rare-earth element alloy, a multilayer thin film in which a magnetic metal and a non-magnetic metal are alternately laminated, or a ferromagnetic material such as an alloy having an L10 type crystal structure. In addition, the free layers 190 may be formed to have a laminated structure in which a first free layer 191, an insertion layer 192, and a second free layer 193 are laminated. That is, the free layers 190 may have a structure in which the first and second free layers 191 and 193 are separated from each other in the vertical direction by the insertion layer 192. In this case, the magnetization directions of the first and second free layers 191 and 193 may be the same or different. For example, both the first and second free layers 191 and 193 may have perpendicular magnetization, or the first free layer 191 may have perpendicular magnetization and the second free layer 193 may have horizontal magnetization. In addition, the insertion layer 192 may be formed of a material having a BCC structure without magnetization. That is, the first free layer 191 may be perpendicularly magnetized, the insertion layer 192 may not be magnetized, and the second free layer 193 may be perpendicularly or horizontally magnetized. In this case, each of the first and second free layers 191 and 193 may be formed of CoFeB, and the first free layer 191 may be formed thinner than the second free layer 193 or may be formed to have the same thickness as the second free layer 193. In addition, the insertion layer 192 may be formed thinner than the first or second free layer 191 or 193. For example, each of the first and second free layers 191 and 193 may be formed to have a thickness of 0.5 nm to 1.5 nm using CoFeB, and the insertion layer 192 may be formed to have a thickness of 0.2 nm to 0.5 nm using a material having a BCC structure, e.g., W.

A third buffer layer 200 is formed on the free layers 190. The third buffer layer 200 may be formed of magnesium oxide (MgO), aluminum oxide ($Al_2O_3$), silicon oxide ($SiO_2$), tantalum oxide ($Ta_2O_5$), or the like. That is, the third buffer layer 200 may be formed of an oxide. In an embodiment of the present invention, the third buffer layer 200 is formed using polycrystalline magnesium oxide. The third buffer layer 200 is formed so that the free layers 190 have perpendicular magnetic properties. That is, oxygen present in the third buffer layer 200 diffuses into the free layers 190 and bonds with a material in the free layers 190, which causes the free layers 190 to have perpendicular magnetic properties. In addition, the third buffer layer 200 may be formed to have a thickness of, for example, 0.8 nm to 1.2 nm.

The capping layer 210 is formed on the third buffer layer 200. The capping layer 210 is formed of a polycrystalline material, for example, a conductive material having a BCC structure. For example, the capping layer 210 may be formed of tungsten (W). When the capping layer 210 is formed of a polycrystalline material, the crystallinity of the magnetic tunnel junction formed under the capping layer 210 may be improved. That is, when an amorphous magnetic tunnel junction is formed on the separation layer 160 having a BCC structure, the amorphous magnetic tunnel junction grows in the crystal direction of the separation layer 160, and the capping layer 210 having a BCC structure is formed on the magnetic tunnel junction. When heat treatment is subsequently performed, the crystallinity of the magnetic tunnel junction may be further improved. In addition, the capping layer 210 serves to prevent diffusion of the upper electrode 220. The capping layer 210 may be formed to have a thickness of, for example, 1 nm to 6 nm.

The upper electrode 220 is formed on the capping layer 210. The upper electrode 220 may be formed of a conductive material such as a metal, a metal oxide, and a metal nitride. For example, the upper electrode 220 may be formed of a single metal selected from the group consisting of tantalum (Ta), ruthenium (Ru), titanium (Ti), palladium (Pd), platinum (Pt), magnesium (Mg), and aluminum (Al) or an alloy thereof.

As described above, in the memory device according to the embodiments of the present invention, the lower electrode 110 is formed of a polycrystalline material, the SyAF layers 140 are formed on the upper part thereof, and then a magnetic tunnel junction is formed. Therefore, since the FCC (111) structure of the SyAF layers 140 does not diffuse into the magnetic tunnel junction, the BCC (100) crystal structure of the magnetic tunnel junction may be preserved, and the magnetization direction of the magnetic tunnel junction may be rapidly changed, thereby increasing the operating speed of a memory. In addition, the SyAF layers 140 may have a structure in which the magnetic layer 141 and the non-magnetic layer 142 are formed. Therefore, the thickness of the SyAF layers 140 may be reduced. As a result, the entire thickness of the memory device may be reduced. That is, in the conventional case, the SyAF layers 140 have a structure in which a non-magnetic layer is formed between two magnetic layers. On the other hand, in the present invention, the SyAF layers 140 include one magnetic layer and one non-magnetic layer. Therefore, the process time may be shortened in subsequent processes such as an etching process, and the width and height ratio of the device after etching may be lowered, thereby enabling a stable process. In addition, the amount of a material used to form the SyAF layers 140, such as rare-earth elements, may be reduced, thereby reducing processing costs.

Figure 20:
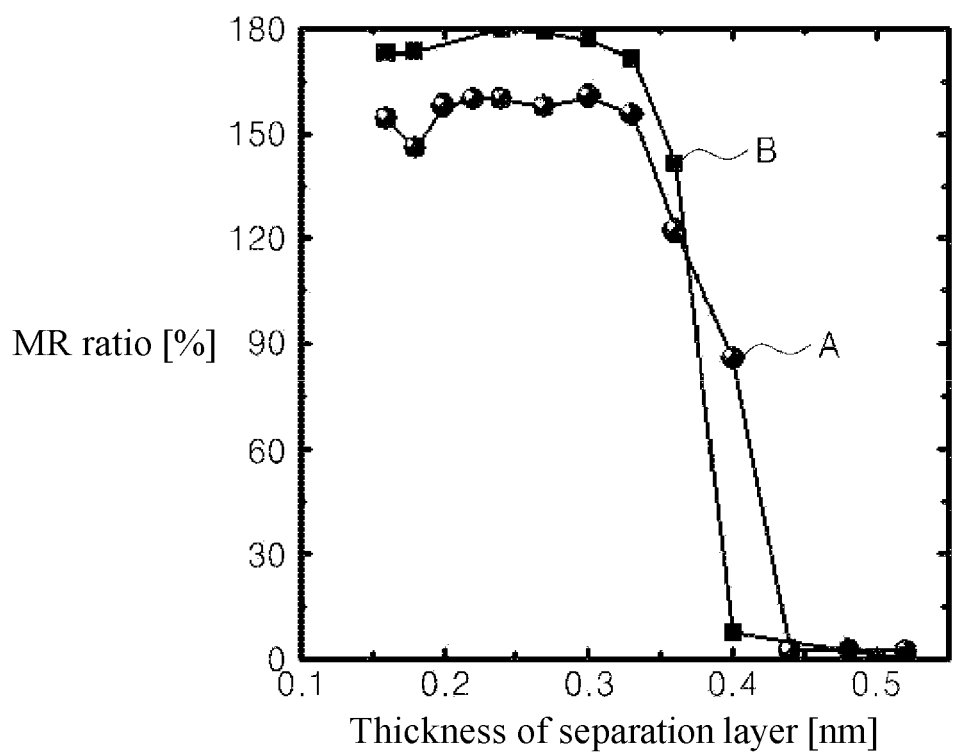
FIG. 20 is a graph showing the magnetoresistance (MR) ratios of a memory device according to a comparative example and a memory device according to the present invention depending on the thicknesses of a separation layer.

FIG. 20 is a graph showing the magnetoresistance (MR) ratios of a memory device according to a comparative example and a memory device according to the present invention depending on the thicknesses of a separation layer. Specifically, in the memory devices of the comparative example and the embodiment of the present invention, a lower electrode, a seed layer, SyAF layers, a separation layer, a magnetic tunnel junction including free layers having a dual structure, a capping layer, and an upper electrode were laminated on a substrate. In the comparative example, the SyAF layers were formed to have a structure in which a first magnetic layer, a non-magnetic layer, and a second magnetic layer were formed. In the embodiment, the SyAF layers were formed to have a structure in which a magnetic layer and a non-magnetic layer were formed. In addition, in the comparative example, the first magnetic layer was formed of $[Co/Pt]_6$ and the second magnetic layer was formed of $[Co/Pt]_3$, whereas in the embodiment, the magnetic layer was formed of $[Co/Pt]_3$. In addition, in the embodiment, a buffer layer was formed between the SyAF layers and the separation layer using Co/Pt, and the separation layer was formed to have a thickness of 0.1 nm to 0.5 nm using W. As shown in FIG. 20, in the case of the comparative example (A), when the separation layer has a thickness of 0.2 nm to 0.3 nm, the magnetoresistance ratio shows a maximum value of about 160%. On the other hand, in the case of the embodiment (B), when the separation layer has a thickness of 0.2 nm to 0.3 nm, the magnetoresistance ratio shows a maximum value of about 179%. Therefore, it can be seen that the magnetoresistance ratio of the embodiment of the present invention is about 20% higher than that of the comparative example. These results may be obtained because the amount of the metal diffused into the magnetic tunnel junction decreases as the thickness of the SyAF layers decreases.

Figure 21:
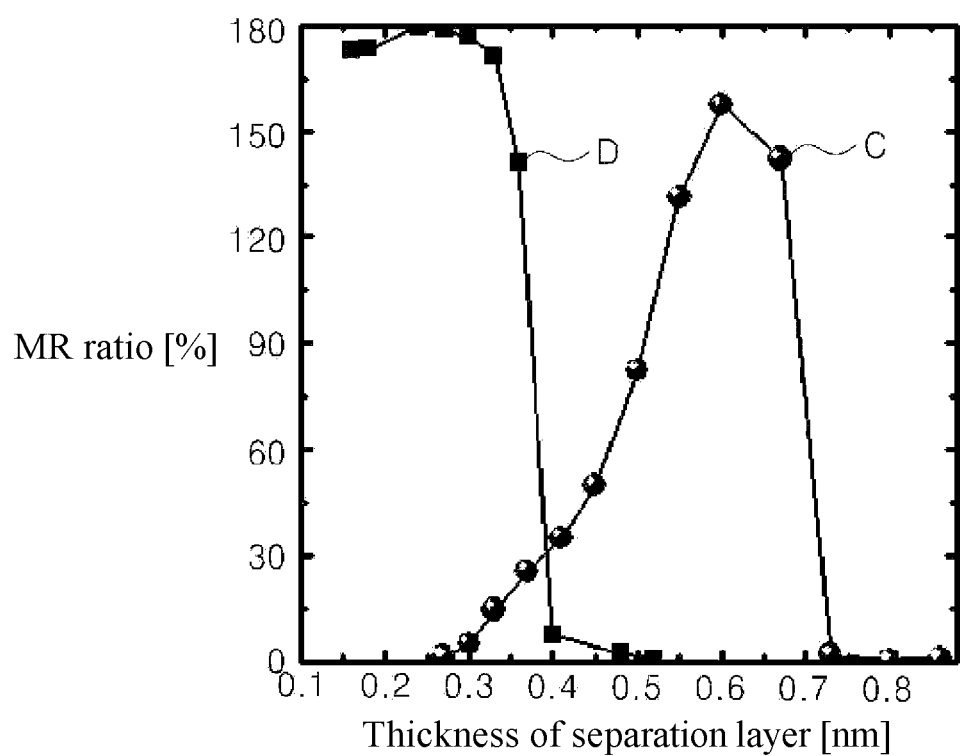
FIG. 21 is a graph showing the tunnel magnetoresistance ratios of memory devices according to embodiments of the present invention depending on the positions of SyAF layers and the thicknesses of a separation layer.

FIG. 21 is a graph showing the tunnel magnetoresistance ratios of memory devices according to embodiments of the present invention depending on the positions of SyAF layers and the thicknesses of a separation layer. That is, the magnetoresistance ratios of a case (Example 1) wherein the SyAF layers having one magnetic layer and one non-magnetic layer are located on the upper part of the magnetic tunnel junction and a case (Example 2) wherein the SyAF layers are located on the lower part of the magnetic tunnel junction are shown. In Example 1, a lower electrode, a seed layer, a magnetic tunnel junction including double free layers, a separation layer, SyAF layers according to the present invention, a capping layer, and an upper electrode were laminated on a substrate. In Example 2, a lower electrode, a seed layer, SyAF layers according to the present invention, a separation layer, a magnetic tunnel junction including double free layers, a capping layer, and an upper electrode were laminated on a substrate. As shown in FIG. 21, in the case of Example 1 (C), when the separation layer has a thickness of 0.55 nm, the magnetoresistance ratio shows a maximum value of about 158%. However, in the case of Example 2 (D), when the separation layer has a thickness of 0.2 nm to 0.3 nm, the magnetoresistance ratio shows a maximum value of about 179%. Therefore, it can be seen that the magnetoresistance ratio of Example 2 of the present invention is about 20% higher than that of the comparative example. These results indicate that, when the SyAF layers are formed on the upper part of the magnetic tunnel junction, the material of the SyAF layers diffuses to the magnetic tunnel junction, whereas, when the SyAF layers are formed on the lower part of the magnetic tunnel junction, the material of the SyAF layers does not diffuse to the magnetic tunnel junction.

The technical idea of the present invention has been particularly described through the aforementioned examples. However, it should be noted that the examples were provided for explanation and the present invention is not limited thereto. In addition, those skilled in the art will understand that various modifications are possible within the range of the technical idea of the present invention.

The invention claimed is:

1. A memory device in which a lower electrode, a seed layer, synthetic antiferromagnetic (SyAF) layers, a separation layer, a magnetic tunnel junction, a capping layer, and an upper electrode are sequentially laminated on a substrate, wherein the seed layer is formed to a thickness of 2 nm to 6 nm with platinum (Pt) that allows the SyAF layers to grow in an FCC (111) direction, a magnetoresistance ratio is 60% to 140% depending on the thickness of the Pt.

2. The memory device according to claim 1, wherein the seed layer comprises a metal selected from the group consisting of titanium (Ti), palladium (Pd), platinum (Pt), magnesium (Mg), cobalt (Co), aluminum (Al), and tungsten (W) or an alloy thereof.

3. The memory device according to claim 1, wherein the magnetic tunnel junction comprises a pinned layer, a tunnel barrier, and free layers, wherein an insertion layer is formed between a first free layer and a second free layer constituting the free layers.

4. The memory device according to claim 1, further comprising an oxide layer formed between the magnetic tunnel junction and the capping layer.

5. The memory device according to claim 4, wherein at least one of the separation layer, the insertion layer, and the capping layer is formed of a material having a bcc structure.

* * * * *